United States Patent
Pasqualini

(10) Patent No.: US 7,388,414 B1
(45) Date of Patent: Jun. 17, 2008

(54) WIDEBAND POWER-ON RESET CIRCUIT WITH GLITCH-FREE OUTPUT

(75) Inventor: Ronald Pasqualini, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/731,690

(22) Filed: Mar. 30, 2007

(51) Int. Cl.
*H03L 7/00* (2006.01)
(52) U.S. Cl. ........................ 327/143; 327/142
(58) Field of Classification Search ............... 327/142, 327/143, 198
See application file for complete search history.

(56) References Cited

U.S. PATENT DOCUMENTS

| | | | |
|---|---|---|---|
| 4,716,322 A * | 12/1987 | D'Arrigo et al. ............ | 327/143 |
| 4,788,454 A * | 11/1988 | Tanagawa et al. ........... | 327/142 |
| 4,900,950 A | 2/1990 | Dubujet ..................... | 307/272.3 |
| 4,939,385 A | 7/1990 | Dubujet ..................... | 307/296.8 |
| 5,103,115 A | 4/1992 | Ueda et al. ................ | 307/272.3 |
| 5,109,163 A | 4/1992 | Benhamida ............... | 307/272.3 |
| 5,321,317 A | 6/1994 | Pascucci et al. .......... | 307/296.4 |
| 5,369,310 A | 11/1994 | Badyal et al. ............... | 327/143 |
| 5,396,115 A | 3/1995 | Coffman et al. ............. | 327/143 |
| 5,446,404 A | 8/1995 | Badyal et al. ............... | 327/143 |
| 5,485,111 A | 1/1996 | Tanimoto .................... | 327/143 |
| 5,744,990 A | 4/1998 | Burstein et al. ............. | 327/143 |
| 5,767,710 A | 6/1998 | Cho ........................... | 327/143 |
| 5,828,251 A | 10/1998 | Freyman et al. ............. | 327/143 |
| 5,847,586 A | 12/1998 | Burstein et al. ............. | 327/143 |
| 5,933,036 A | 8/1999 | Kim ............................ | 327/143 |
| 6,005,423 A | 12/1999 | Schultz ........................ | 327/143 |
| 6,052,006 A | 4/2000 | Talaga, Jr. et al. ........... | 327/143 |
| 6,144,238 A | 11/2000 | Dasgupta .................... | 327/143 |
| 6,160,428 A | 12/2000 | Pasqualini .................. | 327/142 |
| 6,204,701 B1 | 3/2001 | Tsay et al. ................... | 327/143 |
| 6,246,272 B1 | 6/2001 | Takai .......................... | 327/143 |
| 6,346,834 B1 | 2/2002 | Chai ........................... | 327/143 |
| 6,377,090 B1 | 4/2002 | Bruno ......................... | 327/143 |
| 6,744,291 B2 | 6/2004 | Payne et al. ................. | 327/143 |
| 6,801,060 B2 | 10/2004 | Ikehashi et al. ............... | 327/80 |
| 6,943,596 B2 | 9/2005 | Slamowitz et al. .......... | 327/143 |
| 7,019,417 B2 | 3/2006 | Kang .......................... | 307/113 |
| 7,057,427 B2 | 6/2006 | Wadhwa et al. ............. | 327/143 |
| 7,196,561 B2 | 3/2007 | Bhattacharya et al. ...... | 327/143 |
| 2002/0171461 A1 * | 11/2002 | Yamazaki et al. ........... | 327/143 |

OTHER PUBLICATIONS

Wikipedia—Counter, http://en.wikipedia.org/wiki/Counter, pp. 1-2.
Sanjay Kumar Wadha, "Zero Steady State Current Power-On-Reset Circuit With Brown-Out Detector", Proceedings of the 19th International Conference on VLSI Design (VLSID '06), IEEE, 2006, pp. 631-636.
Lai Xinquan, et al., "A Low Quiescent Current And Reset Time Adjustable Power-On Reset Circuit", Institute of Electronic CAD, IEEE, 2005, pp. 568-571.

(Continued)

*Primary Examiner*—Marvin M. Lateef
*Assistant Examiner*—Adam Houston
(74) *Attorney, Agent, or Firm*—Mark C. Pickering

(57) ABSTRACT

A chip is initialized by a power-on reset circuit, after a turned-on power supply has reached a voltage level sufficient for normal chip operation. Logic gating is used to provide a glitch-free trigger signal that prevents erroneous chip re-initialization due to VDD glitches, and to provide a crystal warm-up delay that can be quickly tested without the use of dedicated I/O pins.

20 Claims, 11 Drawing Sheets

OTHER PUBLICATIONS

W.C. Yen and H.W. Chen, Low Power and Fast System Wakeup Circuit, IEE Proc.-Circuits Devices Syst., vol. 152, No. 3, Jun. 2005, pp. 223-228.

Takeo Yasuda, et al., "A Power-On Reset Pulse Generator For Low Voltage Applications", IEEE, 2001, pp. IV-598 thru IV-601.
U.S. Appl. No. 11/639,497, filed Dec. 15, 2006, Pasqualini.

* cited by examiner

US 7,388,414 B1

WIDEBAND POWER-ON RESET CIRCUIT WITH GLITCH-FREE OUTPUT

BACKGROUND OF THE INVENTION

1. Field of the Invention

The present invention relates to power-on reset circuits and, more particularly, to a wideband power-on reset circuit that has a glitch-free output.

2. Description of the Related Art

When a DC power supply is initially switched on, its output voltage rises and ultimately stabilizes at a specified DC value. The time interval from when the power supply is initially switched on, to when its output voltage finally stabilizes, is often referred to as the "power-on reset interval" or the "cold initialization interval".

All on-chip circuits that are connected to the power supply must be forced into their correctly initialized states during cold initialization. If the on-chip circuits are not properly initialized, the circuits could generate false output signals during initialization, or enter the wrong initialized state. Both of these possibilities can cause erratic system behavior and/or system failure.

For chips that derive their DC (VDD) supply voltage from an AC line, the cold initialization interval cannot be less than 4 ms (¼ cycle of the 60 cycle AC line). However, in most cases the cold initialization interval can last considerably longer than this, depending on the rise time specifications of the power supply. Alternatively, for chips that are directly powered from a battery, the cold initialization interval can be extremely short, on the order of a few microseconds.

If the system includes a crystal oscillator, the cold initialization interval must be extended to include a crystal warm-up delay. This warm-up delay must provide sufficient time for the crystal to begin oscillating at the desired frequency, with the desired accuracy. For most crystals, the required warm-up delay is relatively long, on the order of 25 ms to 250 ms.

The cold initialization interval is typically generated by a power-on reset (POR) circuit. Ideally, the POR circuit is a completely on-chip circuit that does not require any package pins or external components, such as a resistor and/or a capacitor. However, when the cold initialization interval must be extended to include a crystal warm-up delay, it is not practical to employ an on-chip RC time constant in order to generate the required warm-up delay.

For example, assuming that the maximum practical value of an on-chip capacitor is 100 pF, a 2500 MΩ resistor would be required in order to generate a 250 ms time delay. However, it is not practical to implement a 2500 MΩ resistor on-chip for two reasons: 1) the chip area consumed would be extremely large, and 2) the resistor current would not be reliable because it would be extremely small (i.e. on the order of 1 nA at 3.3V).

In summary, if the cold initialization interval includes a crystal warm-up delay, a POR circuit cannot use on-chip RC components to generate the crystal warm-up delay. This implies that the POR circuit must be "ratiometric" to the VDD voltage. In other words, the output of the POR circuit must only depend upon the value of the VDD voltage, not upon the ramp rate of the VDD voltage.

Furthermore, a "valid" (sufficiently high) VDD voltage is not available during most of the cold initialization interval because the VDD voltage is ramping up during this interval. As a result, a POR circuit must be able to operate correctly, even when a "valid" VDD voltage is not present.

In addition, a POR circuit must not generate an erroneous reset signal in response to noise on the DC (VDD) power supply line. Power supply line noise can be due to many factors, including simultaneously switching I/O circuits (SSO switching), high speed logic gate switching and high power supply ripple.

Due to the limitations described above, there is a need for an on-chip POR circuit that can generate a crystal warm-up delay without requiring any external components or package pins. Furthermore, the POR circuit must not depend upon the VDD voltage ramp rate or the presence of a valid VDD voltage during most of the cold initialization interval. In addition, the POR circuit must not erroneously respond to noise on the DC (VDD) power supply line.

DETAILED DESCRIPTION OF THE INVENTION

As described in greater detail below, the POR circuit of the present invention utilizes a trigger circuit to indicate that a power supply has turned on and reached a voltage level that is sufficient for normal chip operation, and a logic gate to generate a glitch-free trigger signal that is a logic OR of the trigger signal and a reset signal output by the POR circuit.

Figure 1:
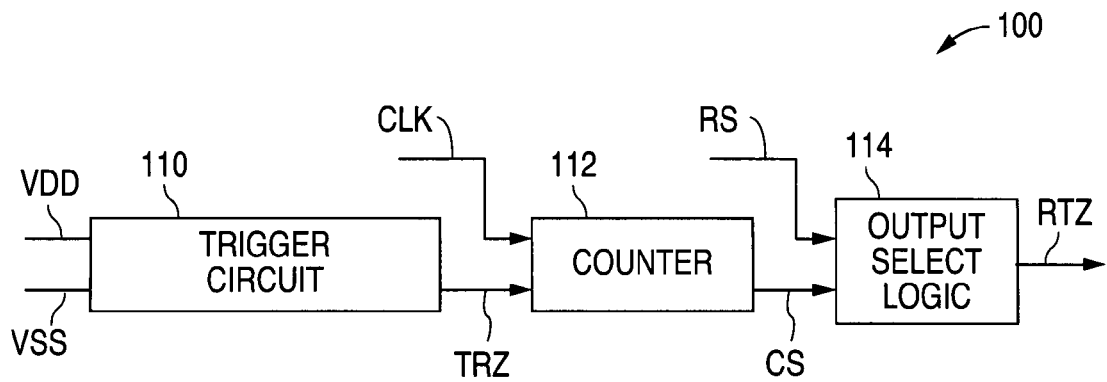
FIG. 1 is a block diagram illustrating an example of a POR circuit 100.

FIG. 1 shows a block diagram that illustrates an example of a POR circuit 100. As shown in FIG. 1, POR circuit 100 includes a trigger circuit 110 that generates a trigger signal TRZ (active low in this example) in response to a rising power supply voltage VDD. In addition, POR circuit 100 also includes a counter 112 that counts the pulses of a clock input signal CLK, to generate a crystal warm-up delay.

As further shown in FIG. 1, POR circuit 100 also includes an output select logic circuit 114 that receives the counter output signal CS and a read input signal RS. In addition, output select logic circuit 114 also generates a reset signal RTZ (active low in this example) in response to the counter output signal CS and the read input signal RS.

In operation, the active low trigger signal TRZ is initially low, and will continue to remain low, until the voltage level of the VDD power supply has become sufficiently high. Thus trigger circuit 110 will remove the active low trigger signal TRZ after the VDD voltage has been initially switched on, and after the VDD voltage level has reached a sufficiently high value. This sufficiently high value must be high enough so that all of the on-chip flipflops and logic gates can operate properly under all circuit conditions. However, if this sufficiently high value is too high (i.e. greater than the minimum steady-state value of VDD), the active low trigger signal TRZ will remain low permanently. This causes the chip to remain in the reset state, resulting in a chip malfunction.

In addition, while the active low trigger signal TRZ remains low, counter 112 is continually cleared to the starting value (usually zero) in its count range. Counting begins when the active low trigger signal TRZ is removed (i.e. when TRZ goes from 0 volts to the rising VDD value that is currently present). Counting ends when counter 112 reaches its terminal count value. When this occurs, the counter output signal CS will change state, usually from low to high, depending upon the counter implementation.

For example, counter 112 can be implemented as a conventional 24-bit ripple counter, whose last stage output will change state, from low to high, after $2^{23}$ pulses (8,388,608 pulses) have been counted. When this occurs, the counter output signal CS will go from low to high.

As previously described, counter 112 will change the logic state of the counter output signal CS, after the crystal warm-up delay (cold initialization interval) has expired. For example, if the frequency of the clock signal CLK is 25 Mhz, and the ripple counter length is 24 bits, then the crystal warm-up delay will be equal to $2^{23}/25$ Mhz=0.336 seconds.

Figure 2:
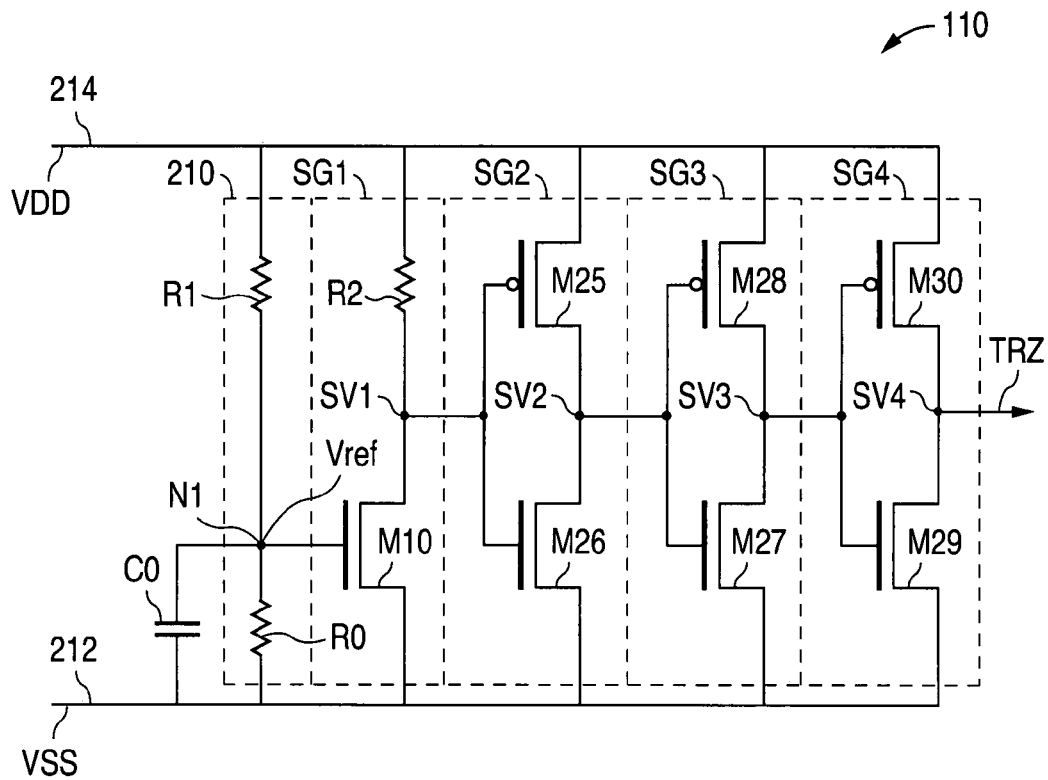
FIG. 2 is a schematic diagram illustrating an example of a trigger circuit 110.

FIG. 2 shows a schematic diagram that illustrates an example of a trigger circuit 110. Trigger circuit 110 of FIG. 2 can be used to implement trigger circuit 110 of FIG. 1. As shown in FIG. 2, trigger circuit 110 includes a voltage divider 210 and four inverter stages SG1-SG4.

In the FIG. 2 example, voltage divider 210 is implemented as a resistor voltage divider that includes a first resistor R0 which is connected to a ground line 212 and an intermediate node N1, and a second resistor R1 which is connected to a power supply line 214 and the intermediate node N1. In addition, voltage divider 210 outputs a reference voltage Vref on the intermediate node N1. The value of the reference voltage Vref is defined by the values of the first and second resistors R0 and R1, and the VDD voltage level.

Referring to FIG. 2, as the VDD voltage on power supply line 214 rises from 0V towards its final DC value, the Vref reference voltage will also rise, according to the R0/R1 resistor ratio. Furthermore, as the VDD voltage rises, the Vref reference voltage will immediately begin to rise, even when the rising VDD voltage level is very close to 0V.

In comparison, if R0 and/or R1 were replaced by active PMOS and/or NMOS transistors (as in some of the prior art), the Vref voltage will not begin to rise until the VDD voltage level exceeds the PMOS/NMOS threshold voltage. For example, if the VDD operating voltage is 1V and the PMOS/NMOS threshold voltage is 0.3V, the PMOS/NMOS transistors cannot respond until the VDD voltage level exceeds 0.3V, which represents 30% of the VDD operating voltage.

In the FIG. 2 example, the first inverter stage SG1 is implemented with an NMOS transistor M10 and a load resistor R2. NMOS transistor M10 has a source connected to ground line 212, a gate connected to receive the reference voltage Vref, and a drain. In turn, load resistor R2 is connected to power supply line 214 and to the drain of transistor M10. In addition, first inverter stage SG1 outputs a first stage output voltage SV1 from the drain of transistor M10.

Referring to FIG. 2, NMOS transistor M10 and load resistor R2 function as a voltage comparator that generates the first stage output voltage SV1. The SV1 voltage output by this comparator depends upon the instantaneous value of the changing VDD voltage, the magnitude of the Vref reference voltage output by voltage divider 210, and the threshold voltage of NMOS transistor M10.

Figure 3:
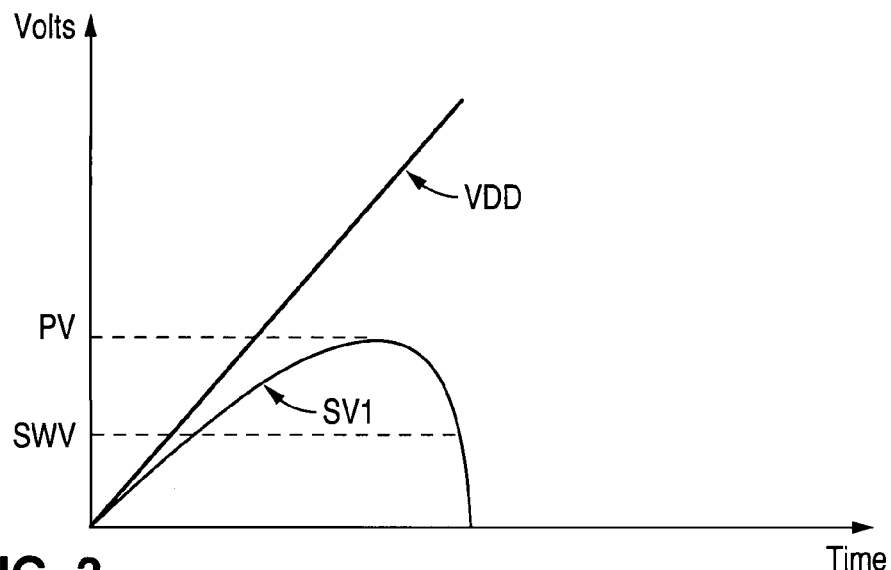
FIG. 3 is a timing diagram illustrating an example of the operation of first inverter stage SG1 in trigger circuit 110.

FIG. 3 shows a timing diagram that illustrates an example of the SV1 output voltage versus time, for the first inverter stage SG1 of trigger circuit 110. FIGS. 4A-4D also show timing diagrams that illustrate examples of the low-frequency time response of trigger circuit 110.

As discussed above, for chips that are powered from the AC line (non-battery applications), the fastest possible rise time of the VDD voltage is approximately 4 ms (for a 60 cycle AC line). However, since the time constants of trigger circuit 110 are much faster than 4 ms, trigger circuit 110 effectively responds to changes in the VDD voltage "instantaneously". As a result, a DC transfer function analysis can be used to analyze the response of trigger circuit 110, from the fastest possible VDD rise time (4 ms), down to the slowest possible VDD rise time (very slow, or approximately DC).

Figure 4A:
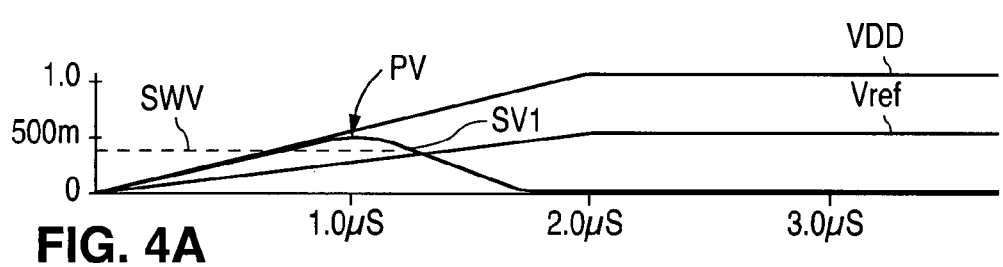
FIGS. 4A-4D are timing diagrams illustrating examples of the low-frequency time response of trigger circuit 110.

As illustrated in FIGS. 3 and 4A, the VDD voltage rises linearly from 0V to its final DC value (1V in FIG. 4A) in 2 µs. Thus, since the reference voltage Vref is a linear function (constant percentage) of the rising VDD voltage, Vref will also rise linearly from 0V to its final DC value in 2 µs.

In addition, because transistor M10 is initially turned off, the first stage output voltage SV1 will initially rise linearly, as the VDD voltage rises linearly. However, when the Vref reference voltage reaches the threshold voltage of NMOS transistor M10 (after approximately 0.8 µs in FIG. 4A), current will begin to flow through transistor M10. Once this current begins to flow, the magnitude of the first stage output voltage SV1 is defined by the relative resistances of transistor M10 and the load resistor R2. At this point, transistor M10 is functioning in its linear region of operation, and essentially behaves as a resistor.

After transistor M10 has turned on, the first stage output voltage SV1 is defined by the M10/R2 resistor ratio. However, as VDD continues to rise, the resistance provided by transistor M10 does not remain constant. Instead, this resistance decreases over time, as the reference voltage Vref on the gate of transistor M10 continues to increase. Eventually, as VDD approaches its final DC value, transistor M10 will provide very low resistance. Thus, when transistor M10 provides very low resistance, substantially all of the VDD voltage will be dropped across load resistor R2. This, in turn, causes the magnitude of the first stage output voltage SV1 to fall close to 0V, as shown in FIGS. 3 and 4A.

Referring to FIGS. 3 and 4A, as the VDD voltage on power supply line 214 increases from 0V, the first stage output voltage SV1 will also increase from 0V, until it reaches a peak voltage PV (at approximately 1.0 µs in FIG. 4A). Furthermore, as the VDD voltage continues to increase, the first stage output voltage SV1 will then begin to decrease, eventually returning close to 0V (at approximately 2.0 µs in FIG. 4A). The net result is that a parabolic-like waveform is generated at the first stage output SV1.

The shape of the SV1 curve shown in FIG. 4A, including the location of the peak voltage PV, depends upon the values of resistors R0, R1, and R2, and the size and threshold voltage of transistor M10. For example, increasing the value of resistor R0 lowers the peak voltage PV, and decreasing the value of resistor R0 increases the peak voltage PV. Similarly, decreasing the value of resistor R1 lowers the peak voltage PV, and increasing the value of resistor R1 increases the peak voltage PV.

Referring to FIG. 2, the second inverter stage SG2 is implemented with a PMOS transistor M25 and an NMOS transistor M26. PMOS transistor M25 has a source connected to the power supply line 214, a gate connected to receive the first stage output voltage SV1, and a drain. NMOS transistor M26 has a source connected to ground line 212, a gate connected to the gate of PMOS transistor M25 to receive the first stage output voltage SV1, and a drain connected to the drain of PMOS transistor M25. In addition, second inverter stage SG2 generates a second stage output voltage SV2 from the drains of PMOS transistor M25 and NMOS transistor M26.

By varying the width ratio of PMOS transistor M25 and NMOS transistor M26, the switching threshold voltage (SWV) of second inverter stage SG2 can be adjusted to lie below the peak output voltage (PV) of first inverter stage SG1. Thus, before the first stage output voltage SV1 reaches the second stage switching threshold voltage SWV, transistor M25 is essentially turned off and transistor M26 is essentially turned on. As a result, second inverter stage SG2 initially outputs a logic low at SV2.

Figure 4B:
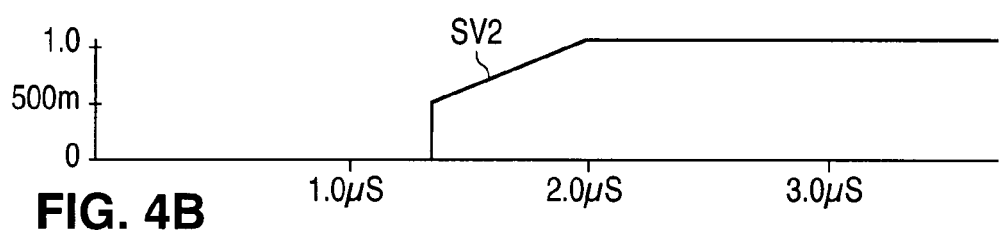

However, after the first stage output voltage SV1 has reached its peak voltage PV and then begins to fall, transistor M25 begins to turn on and transistor M26 begins to turn off. As transistor M25 begins to turn on, it pulls up the second stage output voltage SV2 until this voltage becomes equal to the rising VDD voltage. After this has occurred, the second stage output voltage SV2 continues to follow the rising VDD voltage up to its final DC value (1V in FIG. 4B). Thus, as shown in FIG. 4B, the second stage output voltage SV2 transitions from a logic low to a logic high at approximately 1.3 µs.

In the FIG. 2 example, the third inverter stage SG3 is implemented with a PMOS transistor M28 and an NMOS transistor M27. PMOS transistor M28 has a source connected to power supply line 214, a gate connected to receive the second stage output voltage SV2, and a drain. NMOS transistor M27 has a source connected to ground line 212, a gate connected to the gate of PMOS transistor M25 to receive the second stage output voltage SV2, and a drain connected to the drain of PMOS transistor M28. In addition, third inverter stage SG3 outputs a third stage output voltage SV3 from the drains of PMOS transistor M28 and NMOS transistor M27.

Similarly, in the FIG. 2 example, the fourth inverter stage SG4 is implemented with a PMOS transistor M30 and an NMOS transistor M29. PMOS transistor M30 has a source connected to power supply line 214, a gate connected to receive the third stage output voltage SV3, and a drain. NMOS transistor M29 has a source connected to ground line 212, a gate connected to the gate of PMOS transistor M30 to receive the third stage output voltage SV3, and a drain connected to the drain of PMOS transistor M30. In addition, fourth stage SG4 generates a fourth stage output voltage SV4 from the drains of PMOS transistor M30 and NMOS transistor M29, as the active low trigger signal TRZ.

Figure 4C:
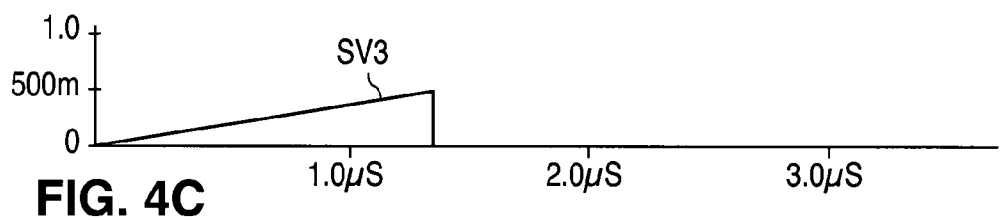
Figure 4D:
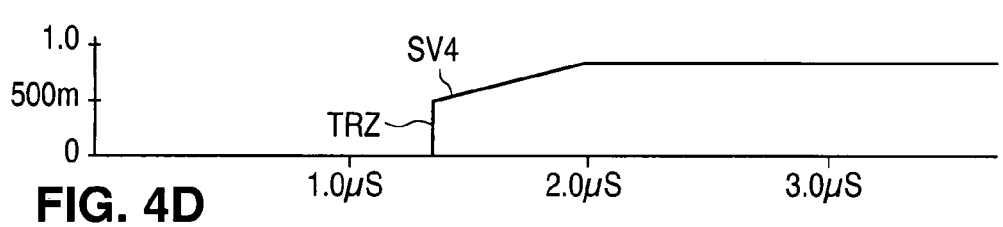

In operation, the third and fourth inverter stages SG3 and SG4 are used to square up the second stage output voltage SV2, before this signal is output as the active low trigger signal TRZ. Thus, as shown in FIGS. 4C and 4D, stages SG3 and SG4 essentially provide a squared up, non-inverted version of the second stage output voltage SV2.

Referring to FIGS. 2 and 4, stages SG3 and SG4 behave as follows. Because the SV2 output voltage of second inverter stage SG2 is initially low, (and will remain low until the first stage output voltage SV1 falls below the switching threshold voltage SWV), transistor M28 is initially turned on and transistor M27 is initially turned off. Thus, as the VDD voltage begins to rise from 0V to its final DC value, the magnitude of SV3, the third inverter stage output voltage, linearly rises from 0V to its peak value.

Furthermore, because the magnitude of the third stage voltage SV3 rises with the increasing VDD voltage, transistor M30 is initially turned off and transistor M29 is initially turned on. As a result, before the first stage voltage SV1 reaches the switching threshold voltage SWV, the SV4 output voltage of the fourth inverter stage SG4 is initially low.

As the third stage output voltage SV3 increases past the switching threshold voltage of the fourth inverter stage SG4, the fourth inverter stage output voltage SV4 (active low trigger signal TRZ) quickly rises. As shown in FIG. 4D, this occurs at the point where the first stage output voltage SV1 falls below the switching threshold voltage SWV.

Referring to FIGS. 4B-4D, when the first stage output voltage SV1 falls below the reference voltage Vref, the SV2 output voltage of the second inverter stage abruptly changes state, causing the SV3 output voltage of the third inverter stage to also abruptly change state. This, in turn, causes transistor M30 to turn on and transistor M29 to turn off, which causes the SV4 (TRZ) output voltage of the fourth inverter stage to abruptly change state.

Because transistor M30 has turned on, it pulls up the fourth stage output voltage SV4 to the VDD voltage, which has not yet reached its final (peak) DC value (1V in FIG. 4D). Thus, as shown in FIG. 4D, after transistor M30 has turned on, it causes the SV4 output voltage to follow the VDD voltage until the VDD voltage reaches its final DC value (1V in FIG. 4D).

Figure 5A:
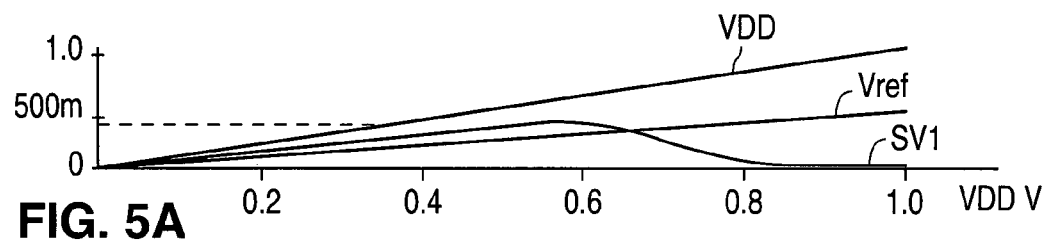
FIGS. 5A-5D are DC transfer function voltage diagrams illustrating examples of the DC response of trigger circuit 110, as a function of the VDD voltage.

FIGS. 5A-5D show DC transfer function voltage diagrams that illustrate an example of the DC response of trigger circuit 110 as a function of the VDD voltage. Referring to FIG. 5A, the reference voltage Vref is a linear function (constant percentage) of the VDD voltage. Thus, as the VDD voltage is ramped up from 0V to its final DC value, the reference voltage Vref also rises from 0V to its final DC value.

The voltage ramp rate for the reference voltage Vref (measured in volts per VDD volt) must be carefully adjusted. If the reference voltage ramp rate is made too low or too high, trigger circuit 110 will not function properly. Thus, as the VDD voltage is ramped up from 0V to its final DC value, the reference voltage ramp rate must be adjusted such that the first stage output voltage SV1 initially rises and then falls, as shown in FIG. 5A. The reference voltage ramp rate can be adjusted by choosing the ratio of resistor R0 to resistor R1.

Figure 5B:
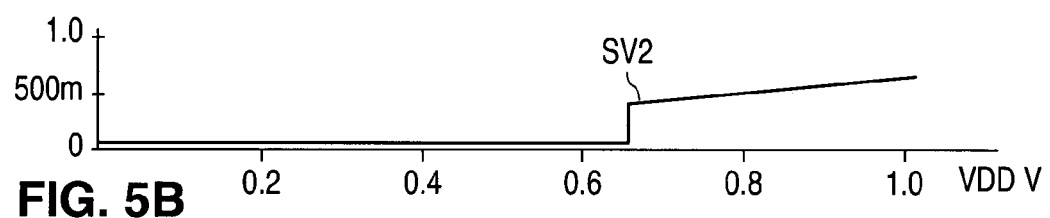

As shown in FIG. 5B, before the magnitude of the first stage output voltage SV1 falls below the switching threshold voltage SWV, the second inverter stage SG2 generates the second stage output voltage SV2 as a logic low. However, after the first stage output voltage SV1 falls below the switching threshold voltage SWV, the second stage output voltage SV2 becomes a linearly increasing ramp that represents a logic high.

Figure 5C:
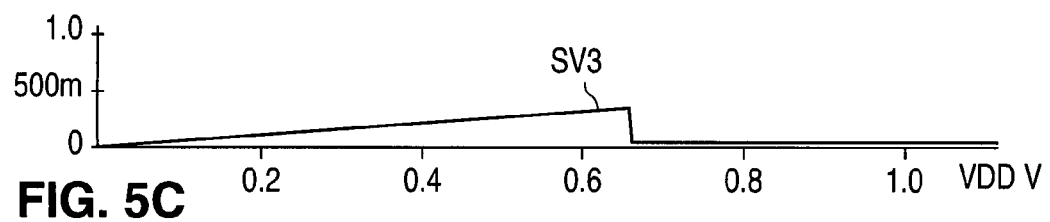

Furthermore, as shown in FIG. 5C, before the magnitude of the first stage output voltage SV1 falls below the switching threshold voltage SWV, the third inverter stage SG3 generates the third stage output voltage SV3 as a linearly increasing ramp that represents a logic high. However, after the first stage output voltage SV1 falls below the switching threshold voltage SWV, the third stage output voltage SV2 becomes a logic low.

Figure 5D:
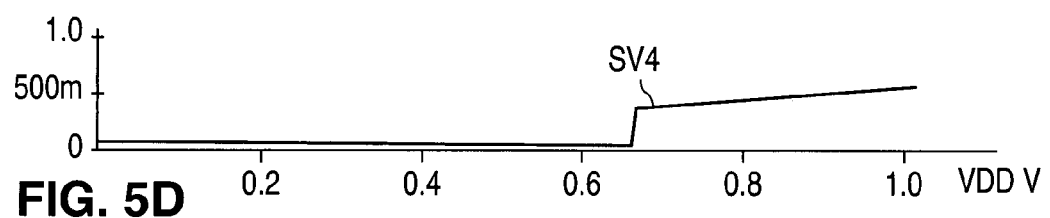

Finally, as shown in FIG. 5D, before the magnitude of the first stage output voltage SV1 falls below the switching threshold voltage SWV, the fourth inverter stage SG4 generates the fourth stage output voltage SV4 as a logic low. However, after the first stage output voltage SV1 falls below the switching threshold voltage SWV, the fourth stage output voltage SV4 becomes a linearly increasing ramp that represents a logic high.

The low-frequency time response of trigger circuit 110, as previously described above, also applies to the case where the ramp rate (volts/ns) of the VDD voltage is fast in comparison to the time constants of trigger circuit 110. Thus, trigger circuit 110 can also be employed in applications where the ramp rate of the VDD voltage is faster than the time constants of trigger circuit 110. For example, some notebook computers employ FET devices to quickly switch the VDD voltage (supplied by a battery) to chips that have been previously powered down.

Figure 6:
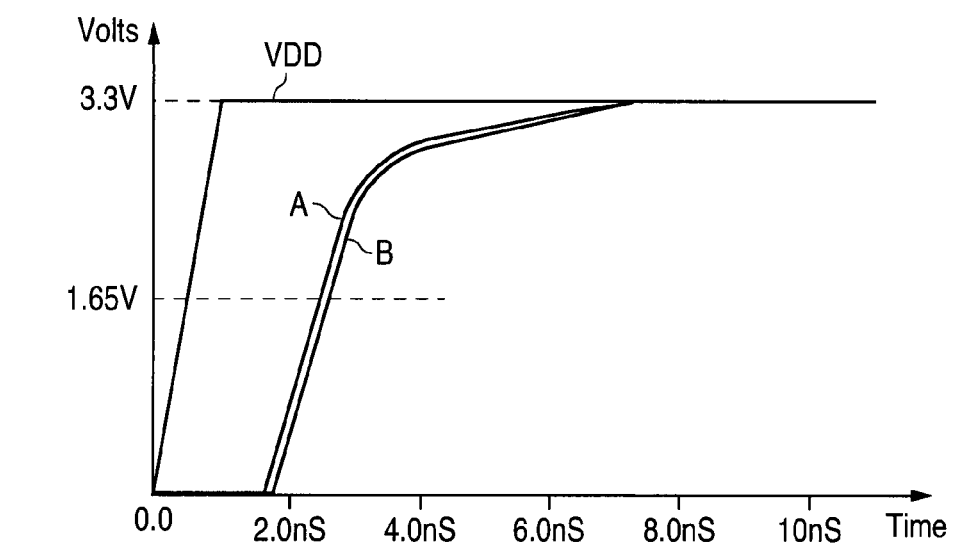
FIG. 6 is a timing diagram illustrating an example of the high-frequency time response of trigger circuit 110.

FIG. 6 shows a timing diagram that illustrates an example of the high-frequency response of trigger circuit 110. As shown in FIG. 6, the VDD voltage has an extremely fast 1ns ramp rate. Referring to FIG. 6, two time responses of trigger circuit 110 are shown: 1) response A shows the fourth stage output voltage SV4 under fast process-voltage-temperature (PVT) conditions at 125°, and 2) response B shows the fourth stage output voltage SV4 under slow PVT conditions at 125°. As shown in FIG. 6, response A and response B are almost identical.

Again referring to the example in FIG. 6, when the 3.3V VDD voltage reaches approximately 50% of its final DC value, the duration of the fourth stage output voltage SV4 (active low trigger signal TRZ) is greater than 2 nS. A duration of this length is usually adequate for most applications. If it is not, the duration can be easily increased by decreasing the transistor sizes in the last two inverter stages SG3 and SG4 of trigger circuit 110.

Since the behavior described above is independent of the ramp rate of the VDD voltage, the active low trigger signal TRZ output by trigger circuit 110 is effectively "ratiometric" to the VDD voltage. Furthermore, although trigger circuit 110 is capable of responding to an extremely fast (1 nS) rise time of the VDD voltage, in actual practice, a fast VDD rise time would only be on the order of a few microseconds.

Referring to FIG. 2, trigger circuit 110 can optionally include a capacitor C0 that is connected between the ground line VSS and the intermediate node N1. The main reason for adding capacitor C0 is to filter out reference voltage noise (Vref noise) that is due to noise on the VDD line. For example, after the VDD voltage has reached its final DC value, capacitor C0 can smooth out the response of the reference voltage Vref to spikes on VDD power line 214.

Figure 7:
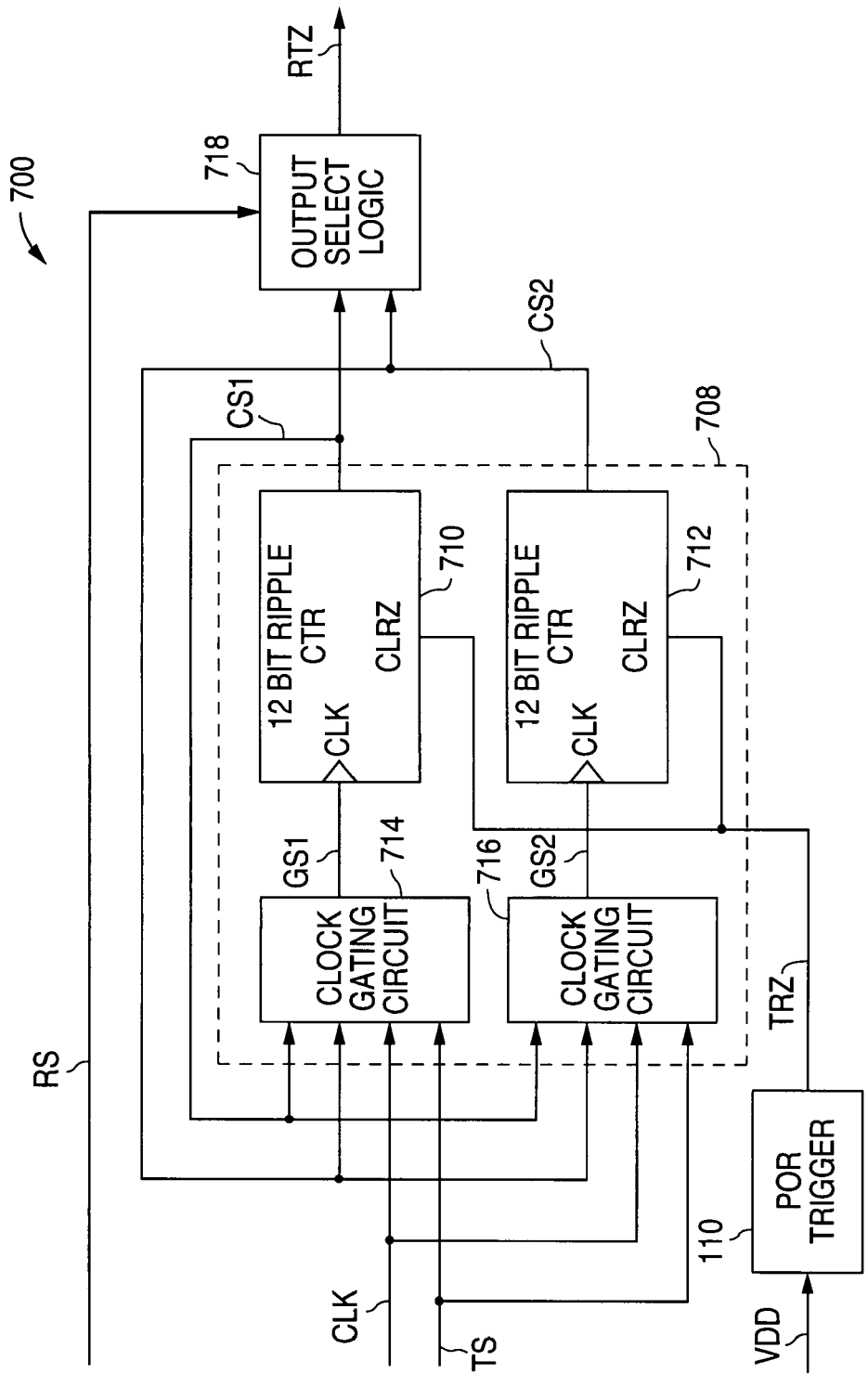
FIG. 7 is a block diagram illustrating an example of a POR circuit 700.

FIG. 7 shows a block diagram that illustrates an example of a POR circuit 700. POR circuit 700 is similar to POR circuit 100 and, as a result, utilizes the same reference numerals and labels to designate the structures and signals that are common to both circuits. As shown in FIG. 7, POR circuit 700 employs counting circuit 708 in place of counter 112 in POR circuit 100. Counting circuit 708 includes two 12-bit counters 710 and 712, and first and second clock gating circuits 714 and 716.

Referring to FIG. 7, counter 710 has an active low clear input CLRZ that clears the counter to the starting value of its count range, in response to the active low trigger signal TRZ. Furthermore, counter 710 also includes a clock input CLK that receives a first gated clock signal GS1, and an output that generates a first counter output signal CS1, when counter 710 reaches the end of its count range.

Again referring to FIG. 7, counter 712 has an active low clear input CLRZ that clears the counter to the starting value of its count range, in response to the active low trigger signal TRZ. Furthermore, counter 712 also includes a clock input CLK that receives a second gated clock signal GS2, and an output that generates a second counter output signal CS2, when counter 712 reaches the end of its count range.

During normal (non-test) operation, counters 710 and 712 are concatenated together by clock gating circuits 714 and 716, to form a single 24-bit counter. However, when the chip is operating in POR test mode, counters 710 and 712 are treated as separate 12 bit counters that can be tested much faster than a single 24-bit counter.

As shown in FIG. 7, clock gating circuit 714 has an input that receives the first counter output CS1, and an input that receives the second counter output CS2. Furthermore, clock gating circuit 714 also has an input that receives a clock signal CLK, and an input that receives a test signal TS. Clock gating circuit 714 also has an output that generates a first gated clock signal GS1.

Again referring to FIG. 7, clock gating logic circuit 716 has an input that receives the first counter output CS1, and an input that receives the second counter output CS2. Furthermore, clock gating circuit 716 also has an input that receives a clock signal CLK, and an input that receives a test signal TS. Clock gating logic circuit 716 also has an output that generates a second gated clock signal GS2.

As further shown in FIG. 7, circuit 700 also includes output select logic 718. Output select logic 718 has a first input that receives the first counter output CS1, and a second input that receives the second counter output CS2. Output select logic 718 also has a third input that receives a read signal RS, and an output that generates the active low POR output signal RTZ.

Figure 8:
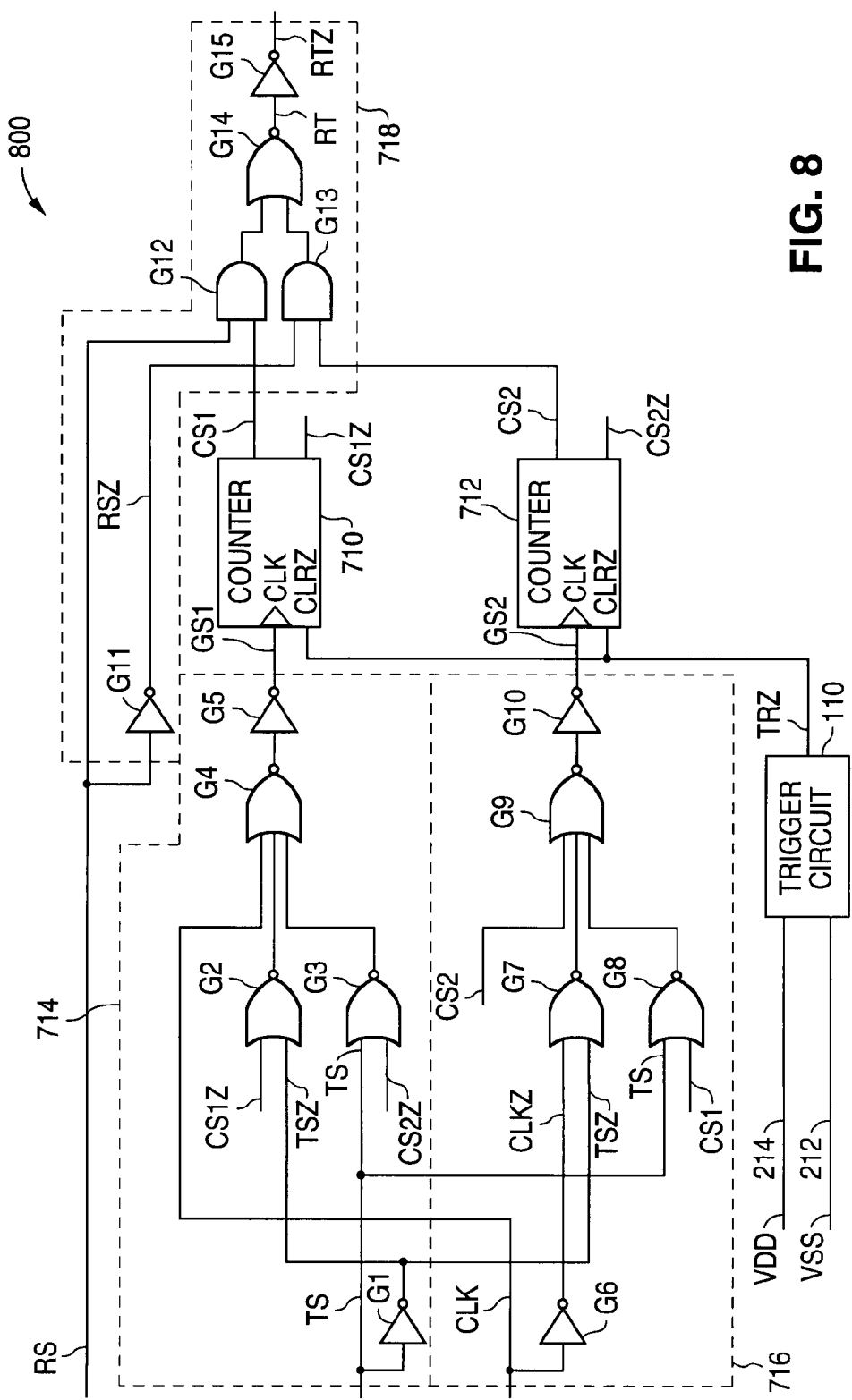
FIG. 8 is a schematic diagram illustrating a POR circuit 800.

FIG. 8 shows a schematic diagram that illustrates a POR circuit 800. POR circuit 800 can be utilized to implement POR circuit 700, and utilizes the same reference numerals to designate the elements that are common to both circuits.

As shown in the FIG. 8 example, first clock gating circuit 714 includes an inverter G1 that inverts the test signal TS to generate an inverted test signal TSZ. First clock gating circuit 714 also includes a NOR gate G2 that receives an inverted first counter output signal CS1Z, and the inverted test signal TSZ. Furthermore, first clock gating circuit 714 also includes a NOR gate G3 that receives an inverted second counter signal CS2Z and the test signal TS. In addition, first clock gating circuit 714 also includes a NOR gate G4 that receives the output of NOR gate G2, the output of NOR gate G3, and the clock signal CLK. Finally, an inverter G5 inverts the output of NOR gate G4 to form the first gated clock signal GS1.

Similarly, second clock gating circuit 716 includes an inverter G6 that that inverts the clock signal CLK to generate an inverted clock signal CLKZ. Second clock gating circuit 716 also includes a NOR gate G7 that receives an inverted clock signal CLKZ and the inverted test signal TSZ. Furthermore, second clock gating circuit 716 also includes a NOR gate G8 that receives the first counter output signal CS1 and the test signal TS. In addition, second clock gating circuit 716 also includes a NOR gate G9 that receives the output of NOR gate G7, the output of NOR gate G8, and the second counter output CS2. Finally, an inverter G10 inverts the output of NOR gate G9 to form the second gated clock signal GS2.

As further shown in the FIG. 8 example, output select logic 718 includes an inverter G11 that inverts the read signal RS to form an inverted read signal RSZ. Output select logic 718 also includes an AND gate G12 that receives the read signal RS and the first counter output signal CS1. Furthermore, output select logic 718 includes an AND gate G13 that receives the inverted read signal RSZ and the second counter output signal CS2.

As shown in FIG. 8, output select logic 718 also includes a NOR gate G14 that receives the output of AND gate G12 and the output of AND gate G13 to output an active high reset signal RT. Finally, output select logic 718 also includes an inverter G15 inverts the active high reset signal RT to output the active low reset signal RTZ.

POR circuit 800 provides two operating modes: a normal operating mode and a test operating mode. In both modes, the first and second ripple counters 710 and 712 are cleared by the active low trigger signal TRZ.

As shown in FIG. 8, the active low trigger signal TRZ is generated by trigger circuit 110. As previously described, the TRZ signal remains low during most of the time interval in which the VDD voltage is ramping up from 0V to its final DC value. This ensures that when first and second counters 710 and 712 begin to count clock pulses, they will both be initially cleared, and they will also have a sufficiently high VDD voltage to operate properly. Of course, while the TRZ signal is low, any clock pulses received by counters 710 and 712 will be ignored, and both counters will remain in their cleared state.

In normal operating mode (TS=0), the two 12-bit ripple counters 710 and 712 are concatenated together to form a single 24-bit ripple counter that is driven by the gated clock signal GS1. Thus, after the active low trigger signal TRZ has gone from low to high, this 24-bit ripple counter provides the required crystal warm-up delay by counting the pulses of the clock signal CLK.

Furthermore, as the VDD voltage is rising from 0V to its final DC value, the 24-bit ripple counter also provides hysteresis to guard against noise on the VDD power supply line. For example, if there is considerable noise on the VDD power supply line while the VDD voltage is rising, the active low trigger signal TRZ could go from the inactive (high) state to the active (low) state, and then return to the inactive (high) state again. If the VDD power supply line is extremely noisy, this behavior could occur multiple times.

If this behavior does occur one or more times, the 24-bit ripple counter will be cleared to the zero state one or more times, and the 24-bit ripple counter will begin to count up from zero one or more times. This behavior essentially provides a form of hysteresis that acts as a noise filter while the VDD voltage is rising. (The classical method of providing hysteresis, which is to employ a Schmitt trigger, cannot be used while the VDD voltage is rising because the Schmitt trigger would not have a "valid" VDD voltage required for proper circuit operation.)

In the present example, the logic equation for the first gated clock signal GS1 is: GS1=CLK+CS1*TS+CS2*TSZ, and the logic equation for the second gated clock signal GS2 is: GS2=CS2+CLK*TS+CS1Z*TSZ. (The operator "+" represents a logical OR, while the operator "*" represents a logical AND). As shown by the logic equations for the first and second gated clock signals, GS1 and GS2 both depend upon the state of the test signal TS and its logical compliment TSZ.

By careful examination of the logic equations for the first and second gated clock signals GS1 and GS2, it can be seen that during test mode, when the test signal TS is active (TS=1 and TSZ=0), counter 710 and counter 712 are not concatenated together. Instead, counter 710 and counter 712 are broken apart and each of them is simultaneously clocked by the same clock signal CLK.

In addition, the first counter clock signal GS1 will be frozen in the logic high state after the last stage of first counter 710 has gone from low to high. This occurs after the trigger signal TRZ has become inactive and 2048 pulses of the clock signal CLK have been counted by first counter 710. Freezing the first counter clock signal GS1 in the logic high state causes counter 710 to stop counting.

Similarly, the second counter clock signal GS2 will be frozen in the logic high state after the last stage of second counter 712 has gone from low to high. This occurs after the trigger signal TRZ has become inactive and 2048 pulses of the clock signal CLK have been counted by second counter 712. Freezing the second counter clock signal GS2 in the logic high state causes counter 712 to stop counting.

It is important to note that first and second 12-bit counters 710 and 712 can be tested using only $2^{11}$=2048 pulses of the clock signal CLK. This compares very favorably with the $2^{23}$=8,388,608 clock pulses that are required to test a 24-bit counter. The net result is that the counter test time is decreased by a factor of 4096, a very significant amount.

By careful examination of the logic equations for GS1 and GS2, it can be seen that in normal operating mode, when the test signal TS is inactive (TS=0 and TSZ=1), first 12-bit ripple counter 710 and second 12-bit ripple counter 712 are concatenated together to form a single 24-bit ripple counter. This occurs because CS1Z, the complemented output from the last stage of first counter 710, is used to clock counter 712 (via gates G8, G9, and G10).

Furthermore, as shown by the logic equation for GS2, in normal operating mode (TS=0 and TSZ=1) the 24-bit ripple counter clock signal will be frozen in the logic high state after the last stage of second ripple counter 712 has gone from low to high. This occurs after the active low trigger signal TRZ has become inactive high, and $2^{23}$=8,388,608 pulses of the clock signal CLK have been counted by the 24-bit ripple counter. Freezing the 24-bit ripple counter clock signal in the logic high state causes the 24-bit ripple counter to stop counting.

The time required for the last stage of the 24-bit ripple counter to go from low to high provides the crystal warm-up delay. For example, if the frequency of the clock signal CLK is 25 Mhz, the crystal warm-up delay will be equal to $2^{23}$/25 Mhz=0.336 seconds. This provides an adequate warm-up delay for most crystals. In the unlikely event that a longer warm-up delay is needed, extra flipflop stage(s) can be added to first counter 710 and second counter 712. Of course, if a shorter warm-up delay is needed, flipflop stages can be removed from first counter 710 and second counter 712.

In normal operating mode, the 24-bit ripple counter stops counting after the crystal warm-up delay (POR interval) has expired, effectively reducing the AC switching power ($CV^2F$ power) in circuit 800 to zero. Minimizing the AC switching power is especially important in low power (i.e. battery-powered) applications.

Referring to FIG. 8, the logic equation for RTZ, the active low output of reset circuit 800, is: RTZ=CS1*RS+CS2*RSZ. By examining this equation, it can be seen that if the read signal RS is high (RS=1 and RSZ=0), the last stage output of first counter 710 will appear on RTZ. Conversely, if the read signal RS is low (RS=0 and RSZ=1), the last stage output of second counter 712 will appear on RTZ.

In normal operating mode (test signal TS=0 and TSZ=1), the read signal RS must be driven low so that the last stage output of the 24-bit ripple counter (output signal CS2 in FIG. 8) can drive the reset signal RTZ. As previously described, the reset signal RTZ will remain active low until the last stage output of the 24-bit ripple counter goes from low to high. This logic change will occur after $2^{23}=8,388,608$ pulses of the clock signal CLK have been counted by the 24-bit ripple counter.

In test mode (test signal TS=1 and TSZ=0), the read signal RS can be driven high or low. Thus, if RS is driven high, the CS1 output of first counter 710 will drive the RTZ output, allowing counter 710 to be tested. Conversely, if RS is driven low, the CS2 output of second counter 712 will drive the RTZ output, allowing counter 712 to be tested. Counters 710 and 712 can be implemented as conventional ripple counters, employing rising edge triggered flipflops or trailing edge triggered flip-flops.

In summary, a POR circuit has been described that eliminates the need for several components, including: 1) the external RC components needed to generate a crystal warm-up delay; 2) a reset package pin to which the external RC components would be connected; and 3) an internal or external Schmitt trigger circuit that would be needed to speed up the extremely slow rise time created by external RC components.

In addition, the POR circuit also includes a crystal warm-up delay counter that can provide a crystal warm-up delay of arbitrary duration. An embodiment of the POR circuit allows a 24-bit warm-up delay counter to be partitioned into two 12 bit counters for test purposes, resulting in significantly less test time.

Furthermore, trigger circuit 110 can tolerate an extremely wide range of power supply voltages, ranging from below 1V to above 5V. In addition, trigger circuit 110 is fully ratiometric to the VDD supply voltage which, in turn, allows trigger circuit 110 to tolerate any VDD voltage rise time, ranging from zero to infinity.

Figure 9:
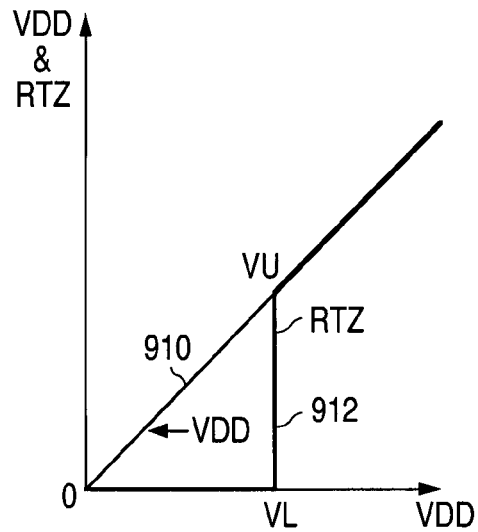
FIG. 9 is a graph illustrating the transfer functions of the VDD voltage and the voltage of the reset signal RTZ.

As shown in FIG. 9, two transfer functions are plotted on the same vertical axis, as a function of the VDD voltage on the horizontal axis. The first transfer function 910 represents the VDD voltage. Thus, because the vertical axis and the horizontal axis both contain VDD, transfer function 910 is a 45° line.

Referring to FIG. 9, the second transfer function 912 represents the voltage of the POR output signal RTZ, as a function of VDD. (The RTZ signal is output by the previously described POR circuits 100, 700, and 800). Again referring to FIG. 9, as the VDD voltage is increased from 0V to its final operating value, the POR output signal RTZ begins at 0V, and remains at 0V, until the VDD voltage reaches the lower trip (switching) point voltage VL.

After the lower trip point voltage VL has been reached, the voltage of the POR output signal RTZ rapidly rises as the VDD voltage is further increased, until the voltage of the POR output signal RTZ becomes equal to the upper trip voltage VU. As the VDD voltage is further increased above the upper trip point voltage VU, the voltage of the POR output signal RTZ follows the VDD voltage (i.e. the two transfer functions coincide).

As shown in FIG. 9, the VL voltage value (measured in the horizontal direction) and the VU voltage value (measured in the vertical direction) are almost identical. This occurs because, as the VDD voltage approaches the lower trip point voltage VL, POR circuits 100, 700, and 800 have a very high voltage gain. Thus, for simplicity, POR circuits 100, 700, and 800 can be considered to have a single trip point voltage VTRIP.

Figure 10:
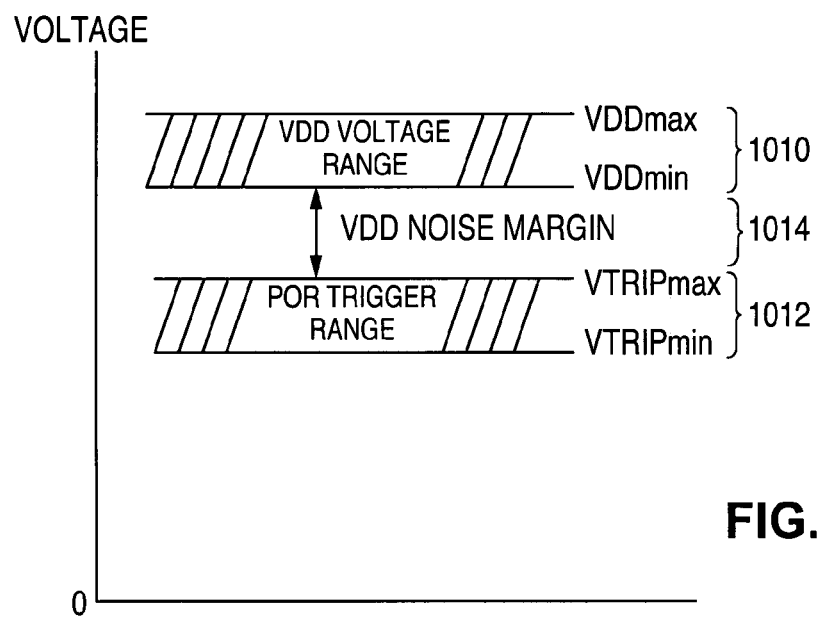
FIG. 10 is a diagram illustrating the relationship between the VDD voltage and the trip point voltage VTRIP.

FIG. 10 shows a diagram that illustrates the relationship between the VDD voltage and the trip point voltage VTRIP. As shown in FIG. 10, the VDD voltage occupies a voltage band (range) 1010 whose lower value is VDDmin and whose upper value is VDDmax. For example, if the specification for the VDD voltage is 3.3V±10%, VDDmin would be equal to 2.97V and VDDmax would be equal to 3.63V. In many cases, this voltage band does not include transient voltage glitches that can occur on the power supply line due to switching activity.

As shown in FIG. 10, the trip point voltage VTRIP also occupies a voltage band (range) 1012 whose lower value is VTRIPmin and whose upper value is VTRIPmax. The width of the trip point voltage band is a function of: 1) variations in the ambient/chip temperature; 2) manufacturing variations in the CMOS transistor parameters (threshold voltage, beta); and 3) manufacturing variations in the resistor values.

As further shown in FIG. 10, the upper value VTRIPmax of trip point voltage band 1012 lies below the lower value VDDmin of VDD voltage band 1010. Thus, as shown in FIG. 10, the distance between trip point voltage band 1012 and VDD voltage band 1010 is equal to the noise margin voltage band 1014. Of course, the exact position and size of trip point voltage band 1012 depends upon the specific PT (process/temperature) conditions of the chip.

Thus, if trip point voltage band 1012 were to move up so that its upper value VTRIPmax lies at or above the bottom of VDD voltage band 1010, the noise margin voltage band 1014 would become zero or negative. This condition can occur when the voltage on the gate of transistor M10 in FIG. 2 does not reach a high enough level to sufficiently turn on transistor M10. In this case, the active low trigger signal TRZ will remain permanently low, causing the active low POR output signal RTZ to also remain permanently low. Of course, this will cause the chip to permanently remain in its reset state, resulting in a serious malfunction.

One limitation of POR circuits 100, 700, and 800 is that their VDD noise margin cannot be easily increased. In other words, referring to FIG. 10, it is difficult to increase the width of noise margin voltage band 1014. The reasons for this difficulty are discussed below.

Referring to FIG. 10, the width of trip point voltage band 1012 depends upon the trigger circuit electrical characteristics and the PT (process/temperature) operating conditions. Thus, for any given trigger circuit, the width of trip point voltage band 1012 will be fixed.

Again referring to FIG. 10, in order to increase the VDD noise margin, the value of VTRIPmax must be decreased. However, if VTRIPmax is decreased, VTRIPmin will also decrease because the width of trip point voltage band 1012 is fixed. Thus, when VTRIPmin is decreased, two serious problems can potentially occur.

The first problem is that the on-chip flipflops and logic gates may not be properly initialized. The reason for this problem is that, when the active low POR output signal RTZ goes from low to high, the rising VDD voltage will be equal to a relatively low value (VTRIPmin). In other words, if the POR output signal RTZ is removed too soon (when VDD is relatively low), the on-chip flipflops and logic gates may not be properly initialized.

The second problem is that, even if the on-chip flipflops and logic gates are properly initialized, the chip may not be able to operate fast enough. The reason for this problem is that, when the POR output signal RTZ becomes inactive, the rising VDD voltage will only be equal to VTRIPmin, which is less than VDDmin, the minimum specified VDD operating voltage. Thus, if the chip contains several "slow" logic paths that only have a small amount of positive timing slack (when the chip is operating at VDD=VDDmin), this timing slack can easily become negative (when the chip is operating at VDD=VTRIPmin). Of course, this negative timing slack can easily result in a serious chip timing failure.

Due to its limited VDD noise margin, trigger circuit 110 is susceptible to voltage glitches (switching noise) that momentarily decrease the VDD voltage during normal operation. These VDD voltage glitches can be generated by several sources, including I/O switching activity on the chip, gate switching activity on the chip, and I/O switching activity on other chips connected to the same VDD supply line.

When the total switching activity is high, the resulting voltage glitches on the VDD supply line can cause the VDD voltage to momentarily drop to a level that reactivates trigger circuit 110, causing its active low TRZ output to go from high to low. This TRZ reactivation will, in turn, reactivate the active low POR output RTZ, causing it to go from high to low (after the 24-bit POR ripple counter has timed out). Of course, when the active low POR output RTZ goes from high to low, the chip will experience an erroneous reset condition, causing it to malfunction. Thus the reactivation of trigger circuit 110 must be avoided at all costs.

The undesired reactivation of trigger circuit 110 can occur as follows. Referring to FIG. 2, when the voltage on power supply line 214 momentarily drops, capacitor C0 will begin to discharge, causing the Vref voltage to decrease. The rate of this decrease depends upon the magnitude and duration of the momentary VDD voltage drop, and the size of capacitor C0.

Since the maximum practical size of on-chip capacitor C0 is limited, VDD glitches that are relatively long (on the order of a few hundred nanoseconds or a few microseconds) can cause the Vref voltage to drop to a level where the gate voltage on transistor M10 is no longer sufficient to keep transistor M10 fully turned on. Thus, if the VDD voltage continues to drop, the Vref voltage will also continue to drop, causing the equivalent resistance of transistor M10 to increase.

If the resistance increase of transistor M10 becomes high enough, it will cause all of the SG inverter stages in FIG. 2 to change state. As a result, the active low trigger circuit output TRZ will go from its inactive high state to its active low state, causing the POR RTZ output to also go from its inactive high state to its active low state (after the POR 24-bit ripple counter has timed out). Of course, this behavior causes the chip to reset itself.

Furthermore, when the VDD voltage glitch goes away and the VDD voltage again rises, the active low trigger circuit output TRZ will go from low to high. This, in turn, will cause the active low RTZ output of the POR to also go from low to high (after the 24-bit POR counter has timed out), causing the chip to run again.

In summary, since VDD glitches can cause the POR output to reset the chip during normal operation, a method must be devised to prevent this reset from occurring.

Figure 11:
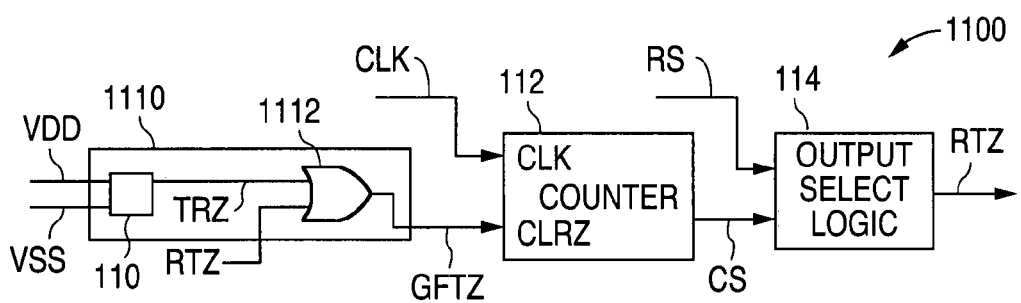
FIG. 11 is a block diagram illustrating a POR circuit 1100 in accordance with the present invention.

FIG. 11 shows a block diagram that illustrates a POR circuit 1100 in accordance with the present invention. POR circuit 1100 is similar to POR circuit 100 and, as a result, utilizes the same reference numerals to designate the structures that are common to both circuits.

As shown in FIG. 11, POR circuit 1100 differs from POR circuit 100 in that POR circuit 1100 utilizes a glitch-free trigger circuit 1110, that includes trigger circuit 110, plus a logic OR gate 1112. Referring to FIG. 11, logic OR gate 1112 performs the logic OR function of active low trigger signal TRZ and active low POR output signal RTZ, to output an active low glitch-free trigger signal GFTZ.

As described above, during normal chip operation the active low trigger signal TRZ will be low when the chip is initially powered up. Furthermore, trigger signal TRZ will remain low, holding the chip in its reset state, until the VDD power supply voltage becomes sufficiently high. At this time trigger signal TRZ will go from low to high, indicating that a sufficiently high VDD voltage is present for normal chip operation.

Similarly, during normal chip operation, the active low POR output signal RTZ, generated by output select logic 114, will be low when the chip is initially powered up. Furthermore, after trigger signal TRZ has gone from low to high, reset signal RTZ will also go from low to high, after 24-bit crystal warm-up counter 112 has timed out.

Since glitch-free trigger signal GFTZ is the logic OR of TRZ and RTZ, glitch-free trigger signal GFTZ will be low when the chip is initially powered up. Furthermore, glitch-free trigger signal GFTZ will also remain low until trigger signal TRZ goes from low to high, forcing glitch-free trigger signal GFTZ to also go from low to high. Thus, when the chip is initially powered up, glitch-free trigger signal GFTZ, generated by glitch-free trigger circuit 1110, operates the same as trigger signal TRZ, generated by trigger circuit 110.

Referring to FIG. 11, 24-bit counter 112 will respond to glitch-free trigger signal GFTZ in the same manner as it responded to trigger signal TRZ. Thus, after glitch-free trigger signal GFTZ has gone from low to high, 24-bit counter 112 will begin to count. After 24-bit counter 112 has timed out (providing the crystal warm-up delay), active low POR output signal RTZ will go from low to high, allowing the chip to run.

In accordance with the present invention, after the chip is initially powered up and POR signals TRZ and RTZ have initially gone from low to high, logic OR gate 1112 will ignore further high to low transitions on its TRZ input, because its RTZ input is presently high.

In other words, because glitch-free trigger circuit 1110 is implemented with trigger circuit 110 plus logic OR gate 1112, during normal chip operation glitch-free trigger circuit 1110 will ignore high to low transitions of the TRZ signal. Thus, if transistor M10 of trigger circuit 110 turns off in response to a VDD voltage glitch and TRZ is forced to go low, logic OR gate 1112 will ensure that the logic state of the glitch-free trigger signal GFTZ remains unchanged (high). Of course, this prevents counter 112 from being reset, which also prevents the entire chip from being reset. Thus the only way to reinitialize the chip is to remove the VDD voltage and ramp it up from 0V once again. This mode of operation is exactly what is needed, in order to avoid accidentally reinitializing the chip due to noise glitches on the VDD power line.

Figure 12:
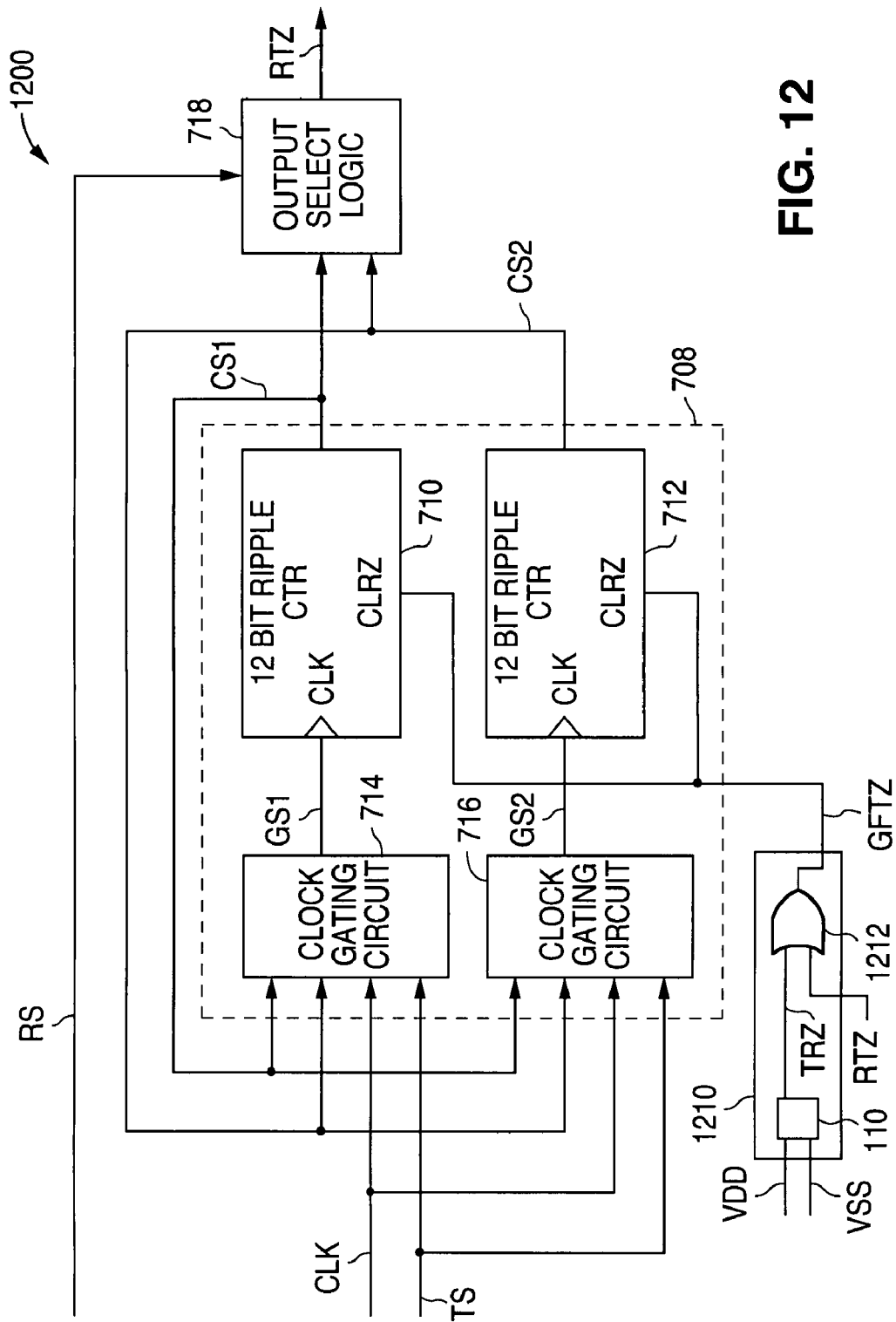
FIG. 12 is a block diagram illustrating an example of a POR circuit 1200 in accordance with the present invention.

FIG. 12 shows a block diagram that illustrates an example of a POR circuit 1200 in accordance with the present invention. POR circuit 1200 is similar to POR circuit 700 and, as a result, utilizes the same reference numerals and labels to designate the structures and signals that are common to both circuits.

As shown in FIG. 12, POR circuit 1200 differs from POR circuit 700 in that POR circuit 1200 utilizes a glitch-free trigger circuit 1210, that includes trigger circuit 110, plus a logic OR gate 1212. Referring to FIG. 12, logic OR gate 1212 performs the logic OR function of active low trigger signal TRZ and active low POR output signal RTZ, to output an active low glitch-free trigger signal GFTZ.

As described above, during normal chip operation the active low trigger signal TRZ will be low when the chip is initially powered up. Furthermore, trigger signal TRZ will remain low, holding the chip in its reset state, until the VDD power supply voltage becomes sufficiently high. At this time trigger signal TRZ will go from low to high, indicating that a sufficiently high VDD voltage is present for normal chip operation.

Similarly, during normal chip operation, the active low POR output signal RTZ, generated by output select logic 718, will be low when the chip is initially powered up. Furthermore, after trigger signal TRZ has gone from low to high, reset signal RTZ will also go from low to high, after concatenated counters 710 and 712 have timed out.

Since glitch-free trigger signal GFTZ is the logic OR of TRZ and RTZ, glitch-free trigger signal GFRZ will be low when the chip is initially powered up. Furthermore, glitch-free trigger signal GFTZ will also remain low until trigger signal TRZ goes from low to high, forcing glitch-free trigger signal GFTZ to also go from low to high. Thus, when the chip is initially powered up, glitch-free trigger signal GFTZ, generated by glitch-free trigger circuit 1210, operates the same as trigger signal TRZ, generated by trigger circuit 110.

Referring to FIG. 12, concatenated counters 710 and 712 will respond to glitch-free trigger signal GFTZ in the same manner as they responded to trigger signal TRZ. Thus, after glitch-free trigger signal GFTZ has gone from low to high, concatenated counters 710 and 712 will begin to count. After concatenated counters 710 and 712 have timed out (providing the crystal warm-up delay), active low POR output signal RTZ will go from low to high, allowing the chip to run.

In accordance with the present invention, after the chip is initially powered up and POR signals TRZ and RTZ have initially gone from low to high, logic OR gate 1212 will ignore further high to low transitions on its TRZ input, because its RTZ input is presently high.

In other words, because glitch-free trigger circuit 1210 is implemented with trigger circuit 110 plus logic OR gate 1212, during normal chip operation glitch-free trigger circuit 1210 will ignore high to low transitions of the TRZ signal. Thus, if transistor M10 of trigger circuit 110 turns off in response to a VDD voltage glitch and TRZ is forced to go low, logic OR gate 1212 will ensure that the logic state of the glitch-free trigger signal GFTZ remains unchanged (high). Of course, this prevents concatenated counters 710 and 712 from being reset, which also prevents the entire chip from being reset. Thus the only way to reinitialize the chip is to remove the VDD voltage and ramp it up from 0V once again. This mode of operation is exactly what is needed, in order to avoid accidentally reinitializing the chip due to noise glitches on the VDD power line.

Figure 13A:
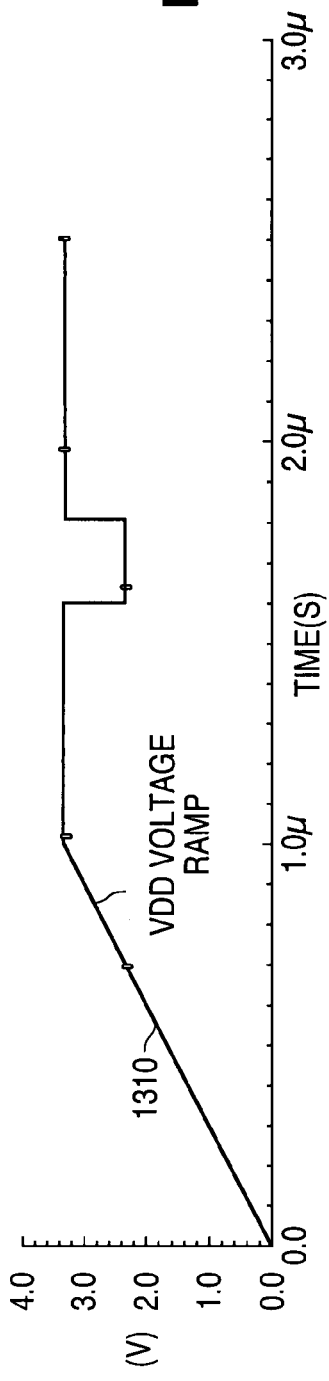
FIGS. 13A-13C are timing diagrams illustrating the operation of POR circuits 100, 700, 800, 1100 and 1200 in accordance with the present invention.
Figure 13B:
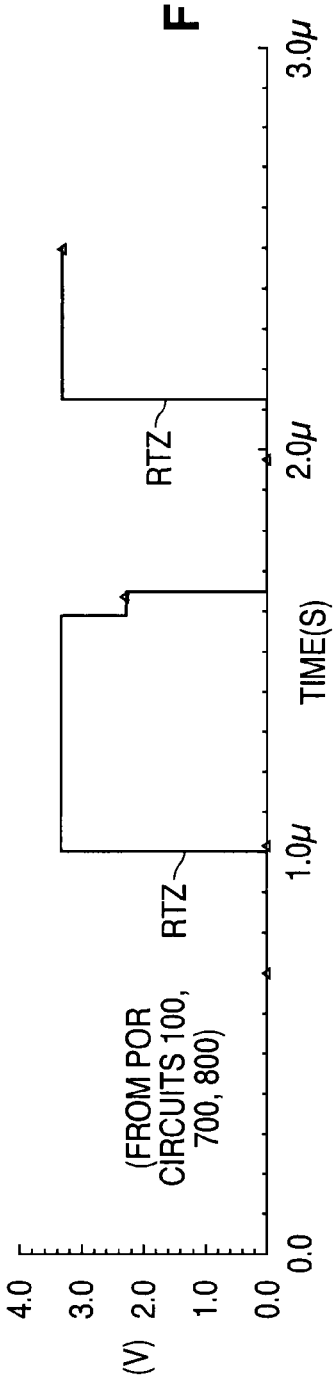
Figure 13C:
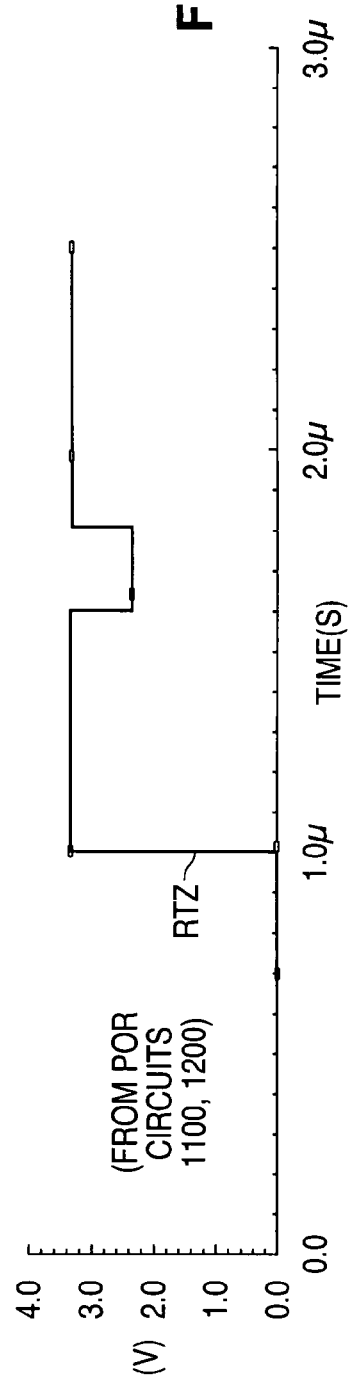

In accordance with the present invention, FIGS. 13A-13C show timing diagrams that illustrate the operation of POR circuits 100, 700, 800, 1100 and 1200. Referring to FIG. 13A, an applied VDD voltage 1310 ramps up from 0V to 3.3V in 1 μs. After the ramp up of applied VDD voltage 1310 has been completed, the VDD voltage line experiences a negative voltage glitch beginning at 1.6 μs. The amplitude of the VDD voltage glitch is 1V and its duration is 200 ns.

As shown in FIG. 13B, POR circuits 100, 700 and 800 generate an active low RTZ output that goes high shortly before the applied VDD voltage reaches 3.3V. This behavior is normal, indicating that the VDD voltage has reached a sufficiently high value, and that the crystal warm up delay has expired.

However, as shown in FIG. 13B, the voltage glitch on the VDD power line causes the active low RTZ output from POR circuits 100, 700 and 800 to fall all the way to 0V for approximately 490 ns. Of course, this behavior will reinitialize the chip, resulting in a functional failure.

As shown in FIG. 13C, POR circuits 1100 and 1200 generate an active low RTZ output that goes high shortly before the applied VDD voltage reaches 3.3V. This behavior is normal, indicating that the VDD voltage has reached a sufficiently high value, and that the crystal warm up delay has expired.

However, as shown in FIG. 13C, the RTZ voltage output by POR circuits 1100 and 1200 does not fall all the way to 0V in response to the voltage glitch on the VDD power line. Instead, the RTZ voltage output by POR circuits 1100 and 1200 only decreases by an amount equal to the VDD voltage glitch (1V). Thus, after the VDD voltage glitch has ended, and the VDD voltage has returned to its normal value, the RTZ voltage output by POR circuits 1100 and 1200 simply follows the recovering VDD voltage. Thus, as shown in FIG. 13C, POR circuits 1100 and 1200 will not erroneously reinitialize the chip in response to a VDD voltage glitch.

As described above, POR circuits 700 and 800 require a test input signal TS to force them into test mode, where they can be quickly tested. In some applications, the test input signal TS comes directly from a dedicated test pin on the chip package, or indirectly from the output of a decoder whose inputs are driven by dedicated test pins on the chip package. In other applications, the test input signal TS comes from a writeable on-chip status/command register, whose flipflops are initialized by the trigger signal TRZ.

Nevertheless, there are many applications that cannot support a dedicated test pin, or a test pin/decoder, or a writeable on-chip command register. Thus there is a definite need for a POR circuit that can be quickly tested without requiring a dedicated test pin, or a test pin/decoder, or a writeable on-chip command register.

Figure 14:
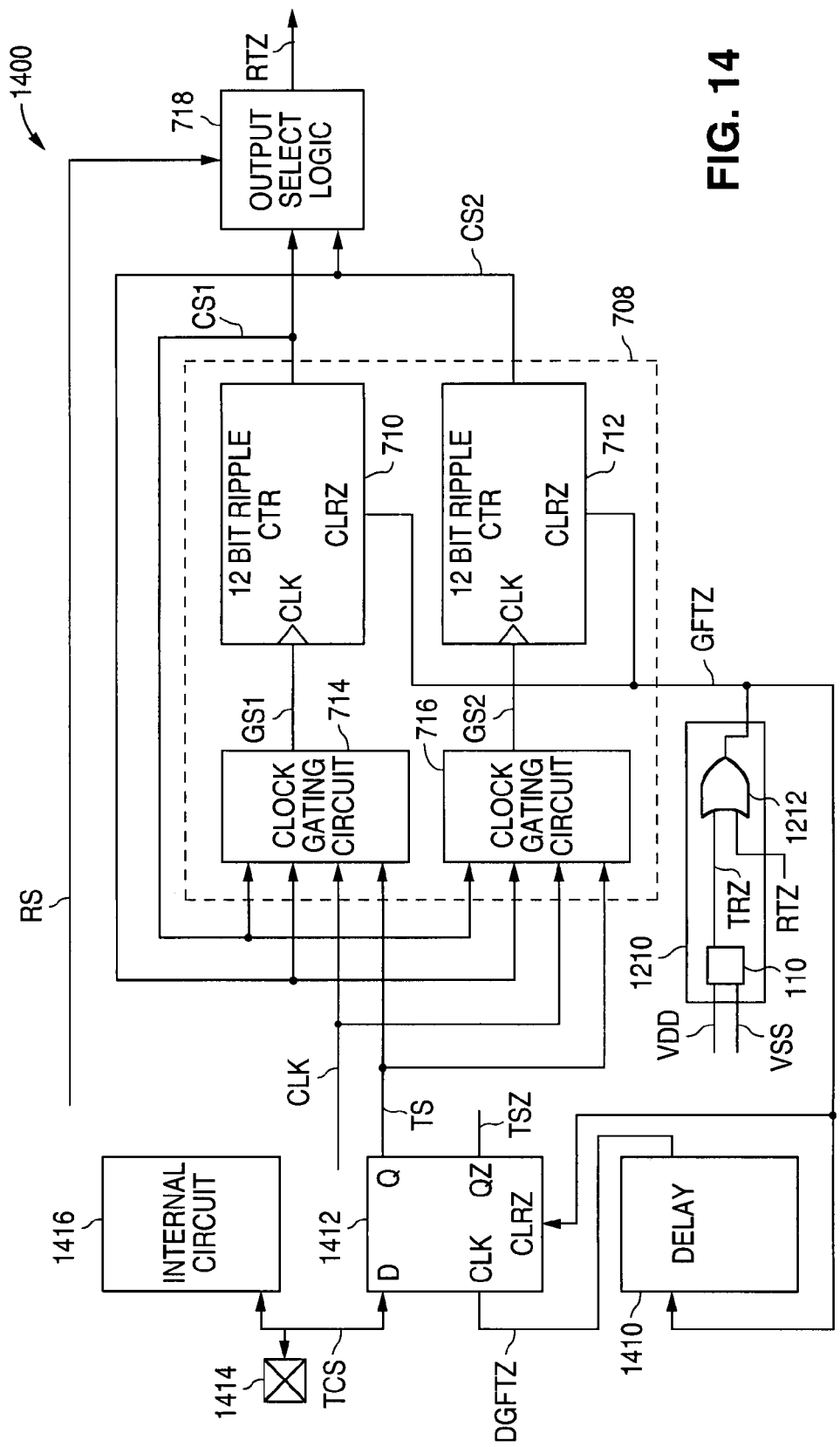
FIG. 14 is a block diagram illustrating a POR circuit 1400 in accordance with the present invention.

FIG. 14 shows a block diagram that illustrates a POR circuit 1400 in accordance with the present invention. POR circuit 1400 is similar to POR circuit 1200 and, as a result, utilizes the same reference numerals and labels to designate the structures and signals that are common to both circuits.

An important advantage of POR circuit 1400 is that it completely eliminates the need for a dedicated test pin to generate the test input signal TS. Thus, instead of requiring a dedicated test pin to generate TS, the circuit shown in FIG. 14 allows any I/O pin, such as I/O pin 1414, to generate TS. This is achieved by allowing the rising edge of the VDD voltage to "sample" the state of any I/O pin, while the VDD voltage is ramping up, as described in greater detail below.

As shown in FIG. 14, POR circuit 1400 differs from POR circuit 1200 in that POR circuit 1400 includes a delay circuit 1410 and a rising-edge-triggered flipflop 1412. Delay circuit 1410 includes an input that receives the glitch-free trigger signal GFTZ, and an output that generates a delayed glitch-free trigger signal DGFTZ.

Flipflop 1412 has a data input that receives a test input signal TCS, a clock input that receives the delayed glitch-free trigger signal DGFTZ, and an active low clear input CLRZ that receives the glitch-free trigger signal GFTZ. Flipflop 1412 also has a non-inverting output that generates a test signal TS, and an inverting output that generates an inverted test signal TSZ.

Referring to FIG. 14, test signal TCS does not need to be a dedicated DC logic signal. In other words, test signal TCS only needs to be asserted while the VDD voltage is ramping up from 0V to its final steady state value. This is true because test signal TCS is sampled by flipflop 1412 only while the VDD voltage is ramping up. This sampling is achieved by allowing the rising edge of the delayed glitch-free trigger signal DGFTZ to clock data into flipflop 1412.

After the VDD voltage has reached its final steady state value, the logic state of test signal TCS is no longer important. Because of this, the user can generate test signal TCS by briefly forcing any chosen I/O pin to the correct logic state while the VDD voltage is ramping up. After the VDD voltage has reached its final steady state value, the briefly forced I/O pin can be used for its normal function.

As shown in FIG. 14, an external I/O pin 1414 is connected to the data input of flipflop 1412, and to an internal circuit 1416. In accordance with the present invention, flipflop 1412 receives the logic state of test signal TCS, from external I/O pin 1414, only while the VDD voltage is rising to its final DC value. Furthermore, if internal circuit 1416 is an input, it can receive a normal input signal from pin 1414 after the rising VDD voltage has reached its final value. Alternatively, if internal circuit 1416 is an output, it can drive a normal output signal to pin 1414 after the rising VDD voltage has reached its final value. (Choosing pin 1414 to be an input pin is preferred, because it eliminates the possibility of temporarily shorting an output pin high or low while VDD is rising. However, it should be noted that many chips allow a single output pin to be temporarily shorted without any ill effects).

Referring to FIG. 14, when the chip is initially powered on, the trigger signal TRZ, the glitch-free trigger signal GFTZ, and the POR output signal RTZ will all be low before the VDD voltage begins to rise. (The same state as POR circuit 1200).

As shown in FIG. 14, while the glitch-free trigger signal GFTZ is low, counters 710 and 712 will be held in their cleared state. In addition, flipflop 1412 will also be held in its cleared state, forcing the chip into its normal operating mode (not its test mode). Furthermore, the low glitch-free trigger signal GFTZ will also propagate through delay circuit 1410, causing the clock input of flipflop 1412 to be initially low.

If the test signal TCS is briefly forced to a logic zero while the VDD voltage is ramping up, the already cleared flipflop 1412 will sample this logic zero on its data input, and flipflop 1412 will remain in its cleared state. As a result, the test signal TS output by flipflop 1412 will remain low, and the inverted test signal TSZ will remain high. This forces the chip into its normal operating mode.

Alternatively, if the test signal TCS is briefly forced to a logic one while the VDD voltage is ramping up, the already cleared flipflop 1412 will sample the logic one on its data input, forcing flipflop 1412 to switch from its cleared state to its non-cleared state. This causes the TS output of flipflop 1412 to switch from low to high, and the TSZ output of flipflop 1412 to switch from high to low. As a result, the chip is forced into test mode.

The purpose of delay circuit 1410 is to provide a small delay between the time that the active low clear signal (GFTZ) is removed from flipflop 1412, and the time that flipflop 1412 is clocked by a rising edge on its clock input. This small delay provides the recovery time needed by the CLRZ input of flipflop 1412.

Figure 15:
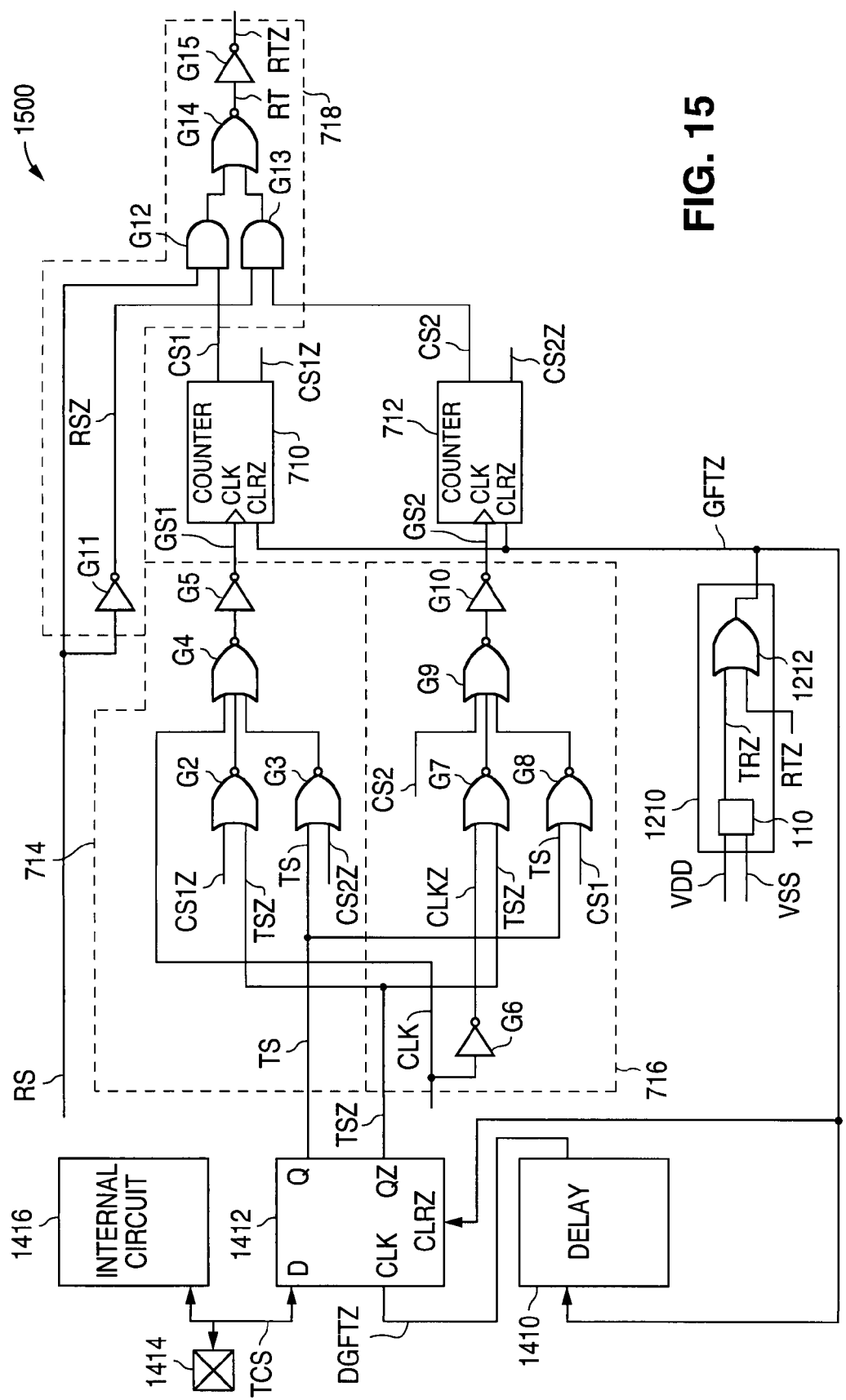
FIG. 15 is a block diagram illustrating a POR circuit 1500 in accordance with the present invention.

FIG. 15 shows a block diagram that illustrates a POR circuit 1500 in accordance with the present invention. POR circuit 1500 is similar to POR circuit 1400 and, as a result, utilizes the same reference numerals and labels to designate the structures and signals that are common to both circuits.

Referring to FIG. 15, POR circuit 1500 is similar to POR circuit 800, except that the TS and TSZ signals in FIG. 15 are generated by the outputs of flipflop 1412. Furthermore, POR circuit 1500 does not require the G1 inverter that is present in POR circuit 800. POR circuit 1500 operates the same as POR circuit 1400.

Figure 16:
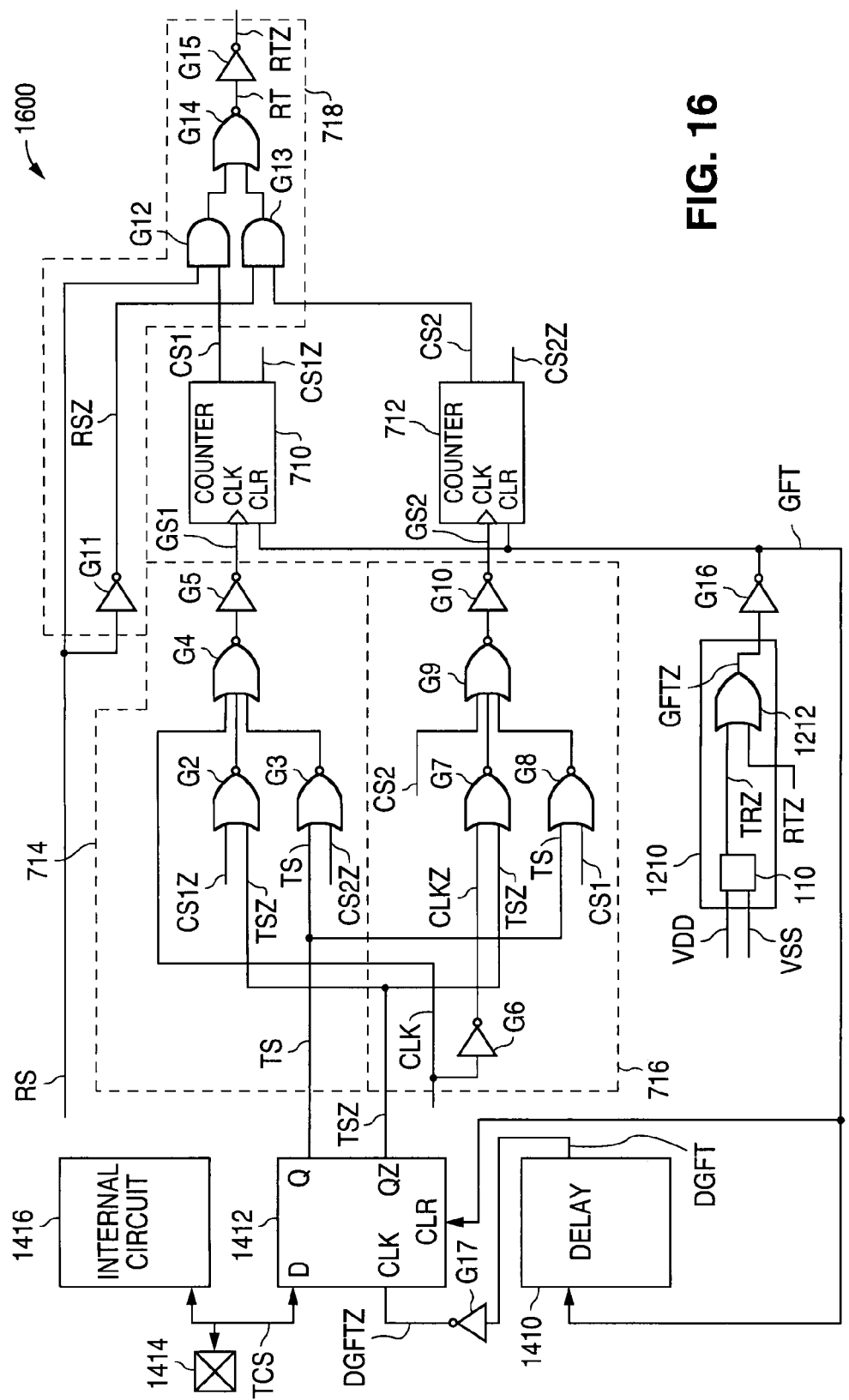
FIG. 16 is a block diagram illustrating a POR circuit 1600 in accordance with the present invention.

FIG. 16 illustrates a POR circuit 1600 in accordance with the present invention. POR circuit 1600 is similar to POR circuit 1400 and, as a result, utilizes the same reference numerals and labels to designate the structures and signals that are common to both circuits.

As shown in FIG. 16, counter 710, counter 712 and flipflop 1412 all utilize an active high clear signal CLR, in lieu of the active low clear signal CLRZ that is utilized in FIG. 1400. Thus, as shown in FIG. 16, an inverter G16 is used to invert the active low glitch-free trigger signal GFTZ, to output an active high glitch-free trigger signal GFT. The active high GFT signal is then utilized to clear counter 710, counter 712, and flipflop 1412.

Referring to FIG. 16, delay circuit 1410 delays the GFT signal at its input, to produce a delayed signal DGFT at its output. In addition, POR circuit 1600 also includes an inverter G17, that inverts the DGFT signal at its input, to produce an inverted signal DGFTZ at its output.

As shown in FIG. 16, the DGFTZ signal is used as the clock input to flipflop 1412. (As a first alternative, inverter G17 can be incorporated into delay circuit 1410, so that delay circuit 1410 both delays and inverts. As a second alternative, inverter G17 can be incorporated into flipflop 1412, so that the clock input of flipflop 1412 will be inverting). POR circuit 1600 operates the same as POR circuit 1400.

It should be understood that the above descriptions are examples of the present invention, and that various alternatives of the invention described herein may be employed in practicing the invention. Thus, it is intended that the following claims define the scope of the invention, and that structures and methods within the scope of these claims and their equivalents be covered thereby.

What is claimed is:

1. A glitch-free trigger circuit comprising:
   a trigger circuit to generate a first signal that identifies when a power supply voltage has risen from a first voltage that is insufficient for normal chip operation to a second voltage that is sufficient for normal chip operation; and
   a logic device connected to the trigger circuit, the logic device having a first input to receive the first signal, a second input to receive a second signal, and an output, the second signal having a first logic state before the first signal indicates that the power supply voltage is sufficient for normal chip operation, and a second logic state after the first signal indicates that the power supply voltage is sufficient for normal chip operation, the logic device to change the output from a first logic state to a second logic state when the first signal indicates that the power supply voltage is sufficient for normal chip operation, and hold the output at the second logic state as long as the second signal has the second logic state, the second signal having only the second logic state during a period that includes a time for the trigger circuit to detect a voltage glitch, and change the first signal from a first logic level to a second logic level and back to the first logic level in response to the voltage glitch.

2. The glitch-free trigger circuit of claim 1 and further comprising an inverter connected to the output of the logic device.

3. The glitch-free trigger circuit of claim 1 wherein the logic device is an OR gate.

4. The glitch-free trigger circuit of claim 1 wherein the first logic state of the second signal is a logic low.

5. The glitch-free trigger circuit of claim 1 wherein the logic device holds the output at the second logic state as long as the second signal has the second logic state prevents chip re-initialization due to voltage glitches.

6. A glitch-free trigger circuit comprising:
   a trigger circuit to change a logic state of a trigger signal when a power supply voltage has risen from a first voltage that is insufficient for normal chip operation to a second voltage that is sufficient for normal chip operation; and a logic device connected to the trigger circuit, the logic device to receive a reset signal and the trigger signal, and generate a glitch-free trigger signal in response to the trigger signal and the reset signal, the glitch-free trigger signal representing a logical OR of the trigger signal and the reset signal; and an output logic circuit connected to receive the glitch-free trigger signal, and change a logic state of the reset signal in response to the glitch-free trigger signal changing logic state.

7. A glitch-free trigger circuit comprising:

a trigger circuit to change a logic state of a trigger signal when a power supply voltage has risen from a first voltage that is insufficient for normal chip operation to a second voltage that is sufficient for normal chip operation; and a logic device connected to the trigger circuit, the logic device to receive a reset signal and the trigger signal, and generate a glitch-free trigger signal in response to the trigger signal and the reset signal, the glitch-free trigger signal representing a logical OR of the trigger signal and the reset signal, the reset signal having a first logic state before the trigger signal indicates that the power supply voltage is sufficient for normal chip operation, and a second logic state after the trigger signal indicates that the power supply voltage is sufficient for normal chip operation; and an output logic circuit connected to receive the glitch-free trigger signal, and change a logic state of the reset signal in response to the glitch-free trigger signal changing logic state.

8. The glitch-free trigger circuit of claim 7 wherein the logic device changes the glitch-free trigger signal from a first logic state to a second logic state when the trigger signal indicates that the power supply voltage is sufficient for normal chip operation, and holds the glitch-free trigger signal at the second logic state as long as the reset signal has the second logic state.

9. The glitch-free trigger circuit of claim 8 and further comprising an inverter connected to the logic device to receive the glitch-free trigger signal.

10. A power on reset (POR) circuit comprising:

a glitch-free trigger circuit having:

a trigger circuit to generate a first signal that identifies when a power supply voltage has risen from a first voltage that is insufficient for normal chip operation to a second voltage that is sufficient for normal chip operation; and a logic device connected to the trigger circuit, the logic device having a first input to receive the first signal, a second input to receive a second signal, and an output, the second signal having a first logic state before the first signal indicates that the power supply voltage is sufficient for normal chip operation, and a second logic state after the first signal indicates that the power supply voltage is sufficient for normal chip operation, the logic device to change the output from a first logic state to a second logic state when the first signal indicates that the power supply voltage is sufficient for normal chip operation, and hold the output at the second logic state as long as the second signal has the second logic state, the second signal having only the second logic state during a period that includes a time for the trigger circuit to detect a voltage glitch, and change the first signal from a first logic level to a second logic level and back to the first logic level in response to the voltage glitch; and an output logic circuit connected to the glitch-free trigger circuit that generates the second signal.

11. The POR circuit of claim 10 and further comprising a delay circuit having an input connected to the output of the logic device.

12. A power on reset (POR) circuit comprising:

a glitch-free trigger circuit having:

a trigger circuit to generate a first signal that identifies when a power supply voltage has risen from a first voltage that is insufficient for normal chip operation to a second voltage that is sufficient for normal chip operation; and a logic device connected to the trigger circuit, the logic device having a first input to receive the first signal, a second input to receive a second signal, and an output, the second signal having a first logic state before the first signal indicates that the power supply voltage is sufficient for normal chip operation, and a second logic state after the first signal indicates that the power supply voltage is sufficient for normal chip operation, the logic device to change the output from a first logic state to a second logic state when the first signal indicates that the power supply voltage is sufficient for normal chip operation, and hold the output at the second logic state as long as the second signal has the second logic state;

an output logic circuit connected to the glitch-free trigger circuit that generates the second signal;

a delay circuit having an input connected to the output of the logic device; and a flipflop having a data input to receive a test circuit signal, a clock input connected to an output of the delay circuit, a clear input connected to the output of the logic device, and a non-inverting output to generate a test signal.

13. The POR circuit of claim 12 and further comprising:

an internal circuit; and an external pin connected to the internal circuit and the data input of the flip-flop.

14. The POR circuit of claim 13 wherein the internal circuit drives signals to the external pin after the power supply voltage reaches a final value.

15. The POR circuit of claim 13 wherein the internal circuit receives signals from the external pin after the power supply voltage reaches a final value.

16. The POR circuit of claim 13 and further comprising a counter connected to the glitch-free trigger circuit, the output logic circuit, and the flip flop.

17. The POR circuit of claim 10 wherein the glitch-free trigger circuit further comprises an inverter connected to the output of the logic device.

18. A power on reset (POR) circuit comprising:

a glitch-free trigger circuit having:

a trigger circuit to generate a first signal that identifies when a power supply voltage has risen from a first voltage that is insufficient for normal chip operation to a second voltage that is sufficient for normal chip operation; and a logic device connected to the trigger circuit, the logic device having a first input to receive the first signal, a second input to receive a second signal, and an output, the second signal having a first logic state before the first signal indicates that the power supply voltage is sufficient for normal chip operation, and a second logic state after the first signal indicates that the power supply voltage is sufficient for normal chip operation, the logic device to change the output from a first logic state to a second logic state when the first signal indicates that the power supply voltage is sufficient for normal chip operation, and hold the output at the second logic state as long as the second signal has the second logic state;

an output logic circuit connected to the glitch-free trigger circuit that generates the second signal;

an inverter connected to the output of the logic device; and a delay circuit having an input connected to an output of the inverter.

19. The POR circuit of claim 18 and further comprising a flipflop having a data input to receive a test circuit signal, a clock input connected to an output of the flip flop, a clear input connected to the output of the inverter, and a non-inverting output to generate a test signal.

20. The POR circuit of claim 19 and further comprising:

an internal circuit; and an external pin connected to the internal circuit and the data input of the flip-flop.

\* \* \* \* \*

UNITED STATES PATENT AND TRADEMARK OFFICE
CERTIFICATE OF CORRECTION

| | |
|---|---|
| PATENT NO. | : 7,388,414 B1 |
| APPLICATION NO. | : 11/731690 |
| DATED | : June 17, 2008 |
| INVENTOR(S) | : Pasqualini |

It is certified that error appears in the above-identified patent and that said Letters Patent is hereby corrected as shown below:

Column 7,

Line 24, delete "Ins" and replace with -- 1ns--.

Column 15,

Line 8, delete "GFRZ" and replace with --GFTZ--.

Signed and Sealed this

Nineteenth Day of August, 2008

JON W. DUDAS
*Director of the United States Patent and Trademark Office*